United States Patent
Izumi et al.

(10) Patent No.: US 12,196,829 B2
(45) Date of Patent: Jan. 14, 2025

(54) RESONANCE CIRCUIT AND METHOD OF MANUFACTURING INDUCTORS AND CAPACITORS

(71) Applicant: National Institute of Advanced Industrial Science and Technology, Tokyo (JP)

(72) Inventors: Konami Izumi, Tokyo (JP); Yutaka Fujii, Fukui (JP); Yu Suzuki, Fukui (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 110 days.

(21) Appl. No.: 18/087,436

(22) Filed: Dec. 22, 2022

(65) Prior Publication Data
US 2023/0221390 A1    Jul. 13, 2023

(30) Foreign Application Priority Data

Dec. 24, 2021  (JP) .................................. 2021-211172
Nov. 2, 2022   (JP) .................................. 2022-176476

(51) Int. Cl.
| | | |
|---|---|---|
| *G01V 3/00* | (2006.01) |
| *G01R 33/56* | (2006.01) |
| *H03H 7/01* | (2006.01) |
| *H03H 1/00* | (2006.01) |

(52) U.S. Cl.
CPC ....... *G01R 33/5602* (2013.01); *H03H 7/0115* (2013.01); *H03H 2001/0085* (2013.01)

(58) Field of Classification Search
CPC .............. G01R 33/3415; G01R 33/543; G01R 33/5659; G01R 33/36; A61B 5/055
USPC ......................................................... 324/309
See application file for complete search history.

(56) References Cited

U.S. PATENT DOCUMENTS

2018/0302125 A1*  10/2018  Tenno ...................... H01Q 7/06
2019/0049543 A1*   2/2019  Anders ............. G01R 33/3607

FOREIGN PATENT DOCUMENTS

| CN | 101137730 A | * | 3/2008 | ............. C09D 11/52 |
| CN | 204857967 U | * | 12/2015 | |
| CN | 104051408 B | * | 3/2018 | ............. H05K 1/113 |
| CN | 109786354 A | * | 5/2019 | ........ H01L 23/49811 |
| CN | 106660355 B | * | 10/2019 | ............. B32B 17/06 |

OTHER PUBLICATIONS

JP H06140569 A (Kou; Kin; Shin) (Year: 1994).*
Sakellariou et al. (2007) *High-resolution, high-sensitivity NMR of nanolitre anisotropic samples by coil spinning*, Nature, vol. 447, pp. 694-697.
Badilita et al. (2012) *Microfabricated Inserts for Magic Angle Coil Spinning (MACS) Wireless NMR Spectroscopy*, PLOS ONE, vol. 7, Issue 8, e42848, 8 pages.

* cited by examiner

*Primary Examiner* — Walter L Lindsay, Jr.
*Assistant Examiner* — Frederick Wenderoth
(74) *Attorney, Agent, or Firm* — Muncy, Geissler, Olds & Lowe, P.C.

(57) ABSTRACT

A resonance circuit includes: an inductor formed along a surface of a first cylindrical form having a central axis; and a capacitor formed along a surface of a second cylindrical form having the central axis, wherein the inductor and the capacitor are electrically connected to each other to form a closed loop.

9 Claims, 18 Drawing Sheets

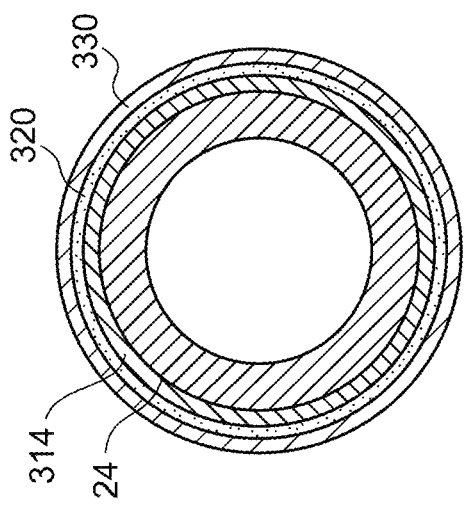
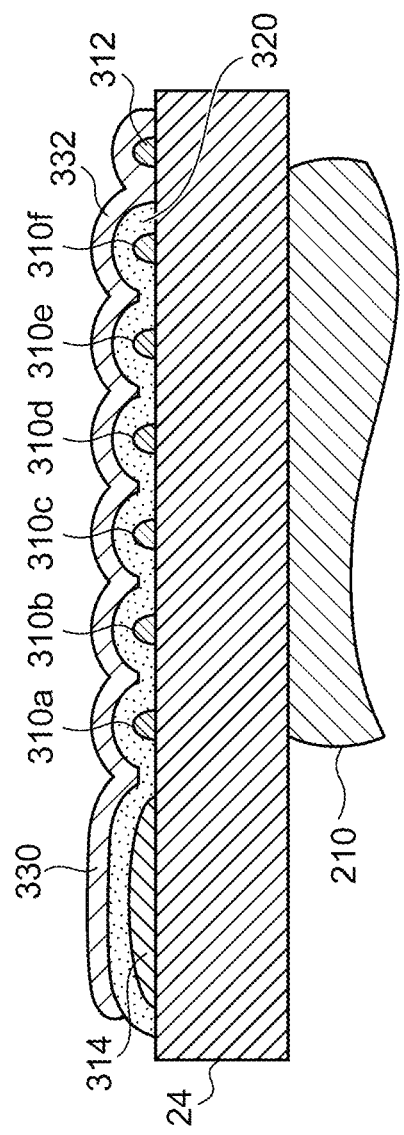

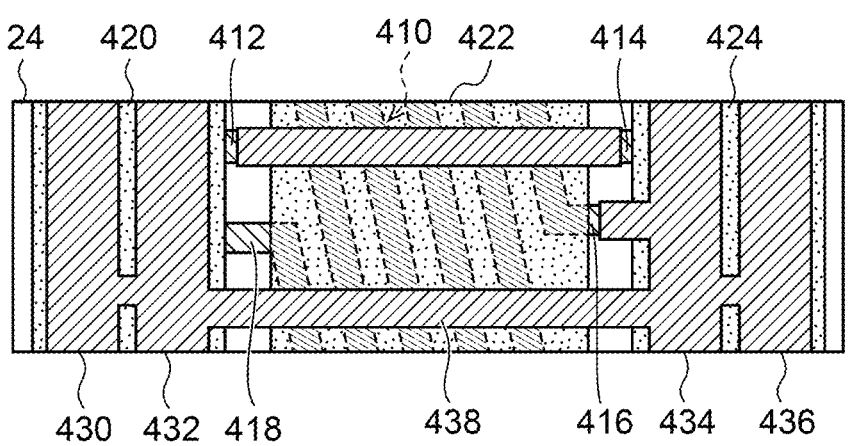
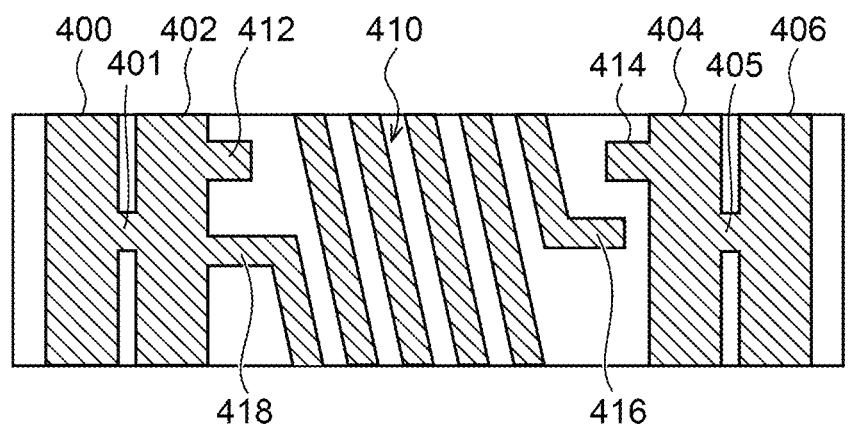
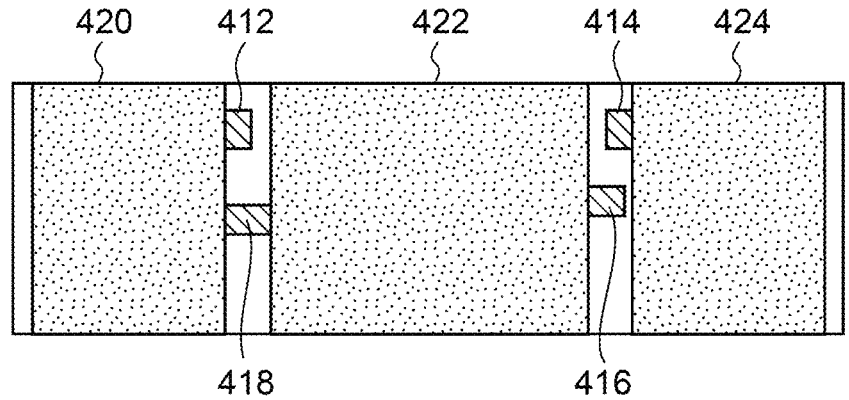
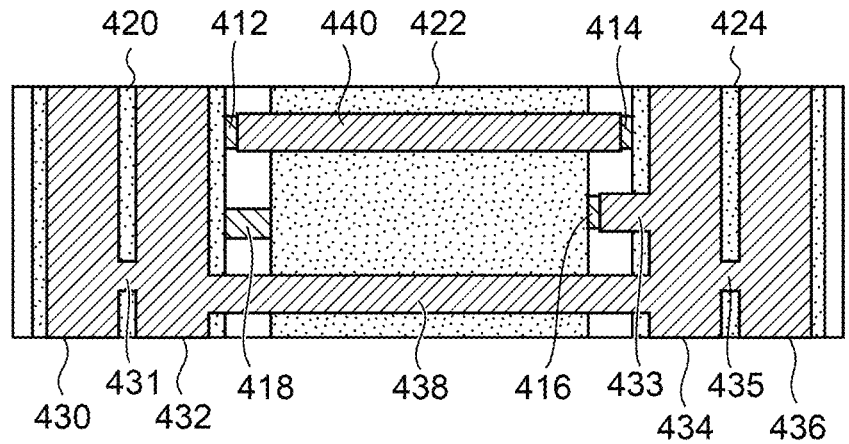

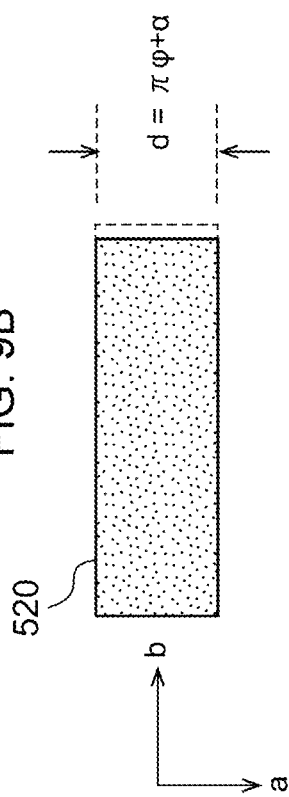
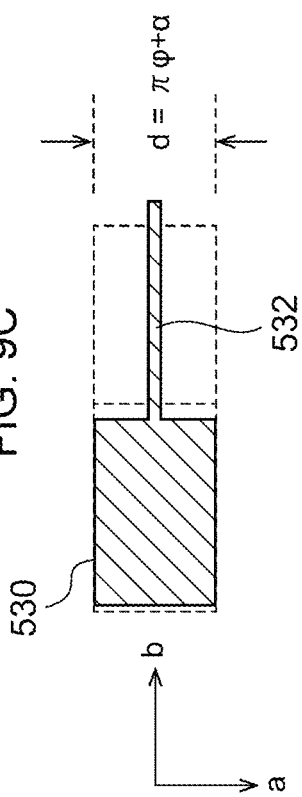
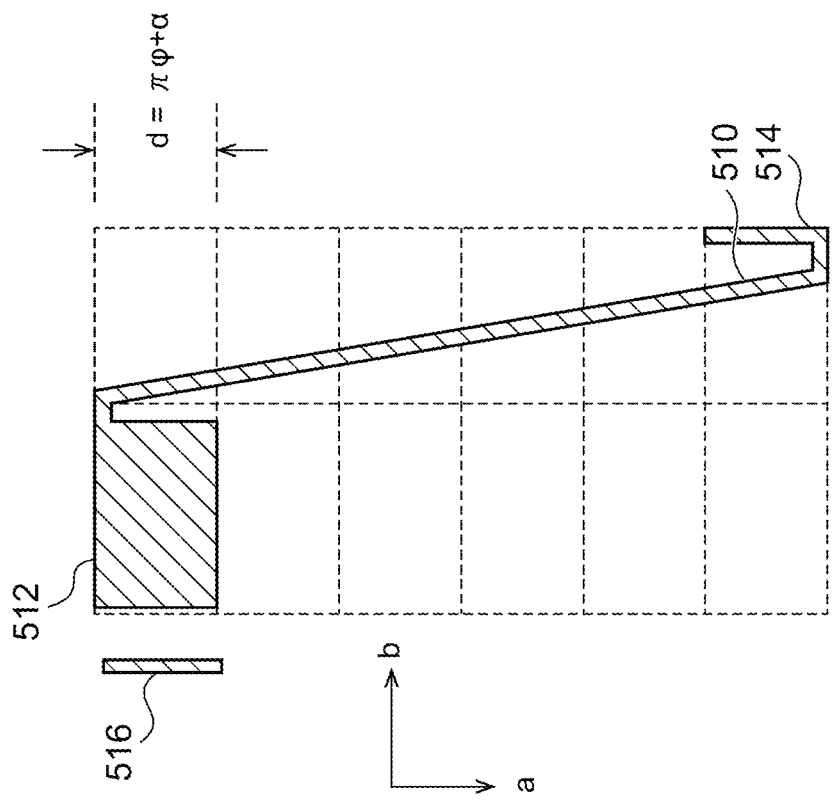

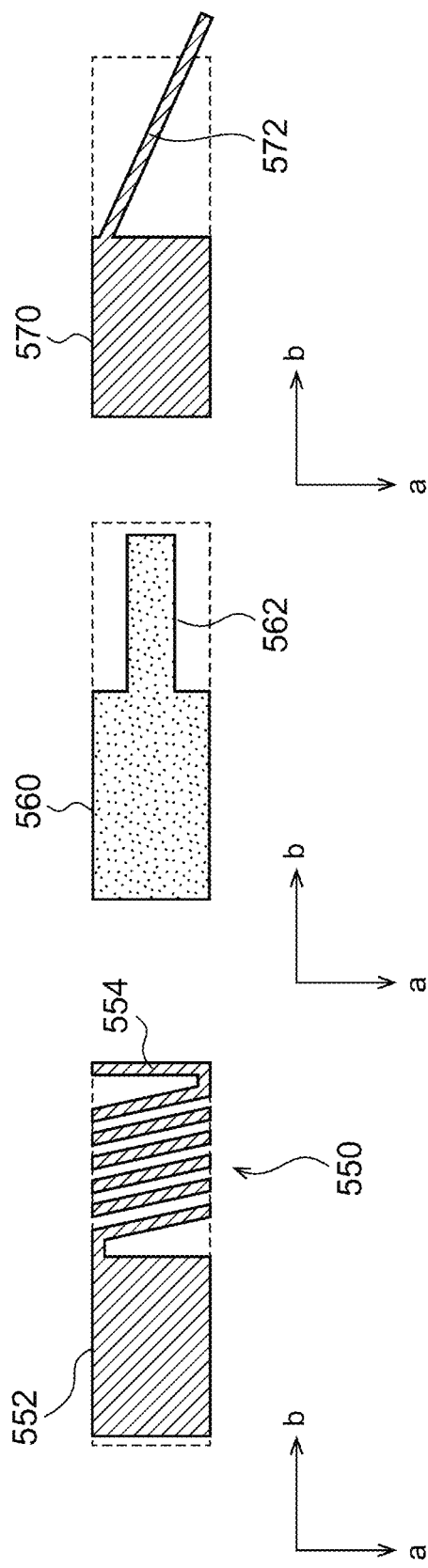

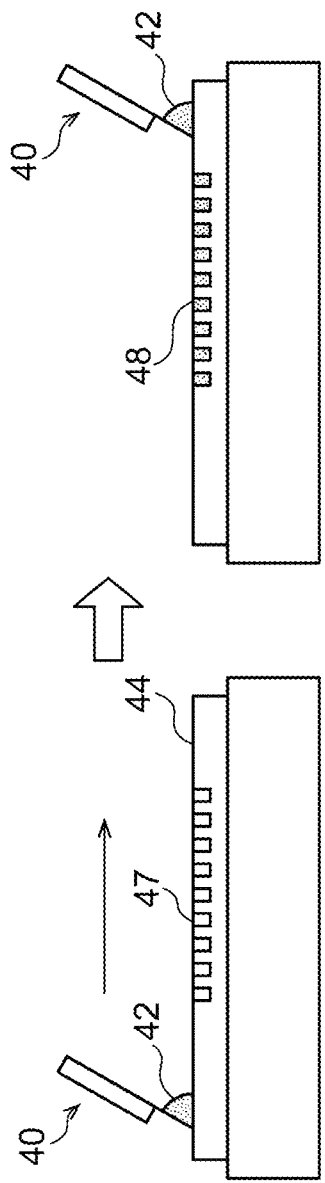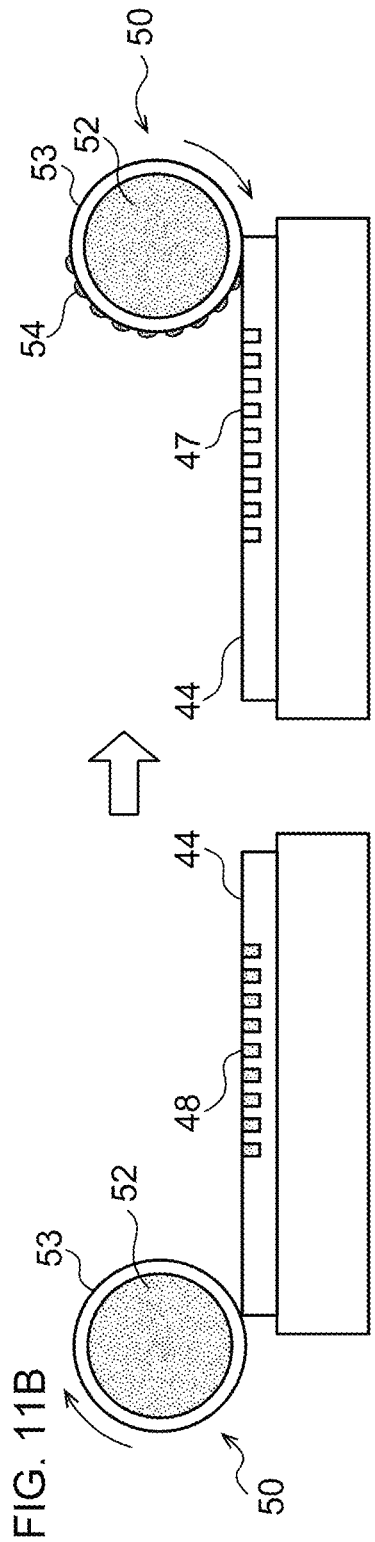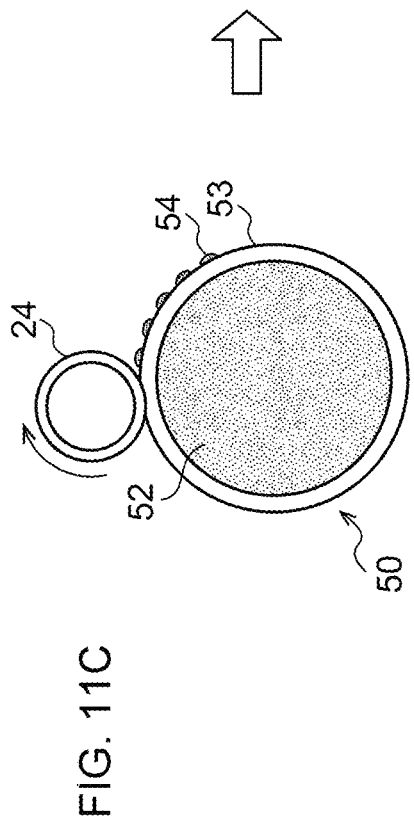

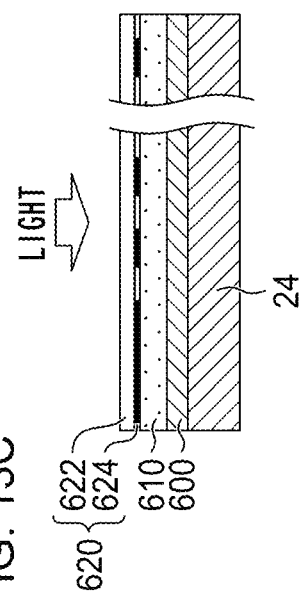
FIG. 13A
FIG. 13B
FIG. 13C
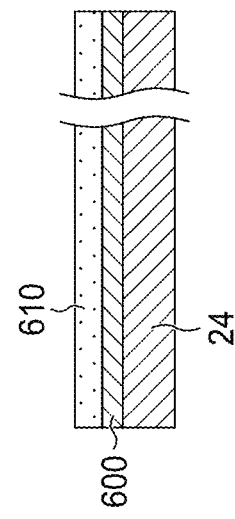
FIG. 13D
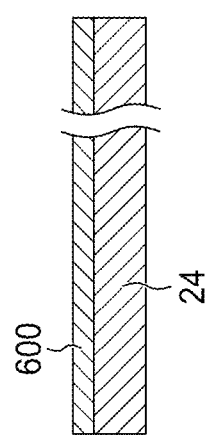
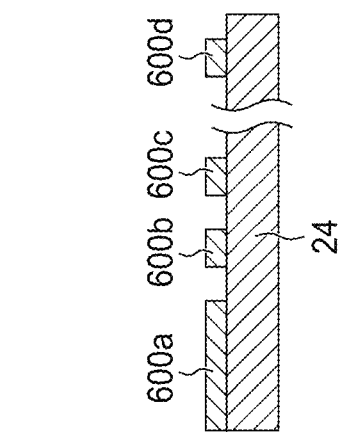
FIG. 13F
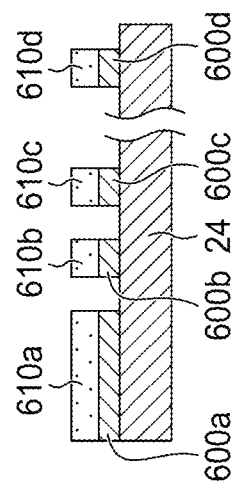
FIG. 13E
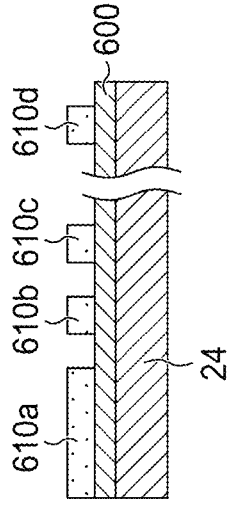

RESONANCE CIRCUIT AND METHOD OF MANUFACTURING INDUCTORS AND CAPACITORS

BACKGROUND OF THE INVENTION

1. Field of the Invention

The present disclosure relates to a resonance circuit and a method of manufacturing inductors and capacitors.

2. Description of the Related Art

A nuclear magnetic resonance (NMR) apparatus is an apparatus for analyzing, for example, the molecular structure of a sample by irradiating the sample placed in a strong magnetic field with radio frequency (RF) waves to induce nuclear magnetic resonance and detecting an NMR signal by using a coil for detection. NMR measurement is capable of non-destructive analysis of a material that can only be retrieved or synthesized in a minute amount and so is used to search for a novel material. As a scheme to improve sensitivity of detection of an NMR signal of a sample in a minute amount, the scheme of increasing magnetization induced in a nuclear spin system by increasing the static magnetic field applied to the sample (increasing the measurement frequency) has been pursued for many years. Recently, however, situations such as growing sizes of facilities for increasing the static magnetic field or increase in cost have arisen.

Further, numerous integral calculations are necessary so that a long measurement time is required in order to obtain an NMR spectrum having a sufficient precision in the case the sample is in a minute amount and the signal intensity is low. This may make analysis difficult by resulting in lack of machine time or, in the case the sample is a biochemical sample or the like, failure of the sample to withstand prolonged measurement.

Meanwhile, a scheme called magic angle spinning (MAS), whereby a sample tube with a sample inserted inside is tilted at an angle called a magic angle (about 54.7°) relative to the direction of a strong magnetic field, and the sample tube is rotated in that state for measurement, is known as a scheme used to sharpen the peak of an NMR spectrum in a solid state NMR apparatus.

Recently, a scheme called magic angle coil spinning (MACS), whereby, for MAS-NMR measurement, a sample is inserted inside the inductor of a resonance circuit comprised of the inductor and a capacitor connected in series, and the resonance circuit is introduced into a sample tube along with the sample inside for the purpose of improving sensitivity of detection of a signal when a sample in a minute amount is subject to MAS-NMR measurement, has attracted attention (see non patent literatures 1, 2). The RF magnetic field generated in the inductor is intensified by resonance of the resonance circuit, and this can increase sensitivity of detection of an NMR signal.

[Non patent literature 1] Sakellariou, G. Le Goff & J.-F, Jacquinot. (2007) High-resolution, high-sensitivity NMR of nanolitre anisotropic samples by coil spinning, Nature, 447, 694-697.

[Non patent literature 2] Badilita, B. Fassbender, K. Kratt, A. Wong, C. Bonhomme, D. Sakellariou, J. G. Korvink, U. Wallrabe (2012) Microfabricated Inserts for Magic Angle Coil Spinning (MACS) Wireless NMR Spectroscopy, PLOS ONE, 7, e42848.

In MAS-NMR, the sample tube is rotated at a high speed (e.g., about 3000 revolutions per second) for the purpose of sharpening the spectrum. It is therefore necessary to fill the sample tube with the sample so that the sample tube does not lose balance during rotation. This is also applicable to MACS-NMR described above. If the weight balance in the rotational direction or the longitudinal direction of the sample tube is lost, the rotational axis of the sample tube will wobble during rotation. The sample tube is housed in an expensive NMR probe. If the rotational axis of the sample tube wobbles during rotation, the sample tube may come into contact with the NMR probe and, which could possibly break the NMR probe in some cases.

In the technologies described in non-patent literatures 1 and 2, the resonance circuit provided in the sample tube is comprised of a commercially available capacitor connected to a manually wound copper coil. It had therefore been impossible to rotate the sample tube at a sufficiently large speed because the weight balance of the sample tube cannot be maintained.

SUMMARY OF THE INVENTION

The present disclosure addresses the issue described above, and an illustrative purpose of an embodiment is to provide a technology of facilitating establishment of weight balance of a resonance circuit.

A resonance circuit according to an embodiment of the present disclosure includes: an inductor formed along a surface of a first cylindrical form having a central axis; and a capacitor formed along a surface of a second cylindrical form having the central axis. The inductor and the capacitor are electrically connected to each other to form a closed loop.

Another embodiment of the present disclosure relates to a method of manufacturing an inductor and a capacitor. The method of manufacturing includes: firstly forming a first conductive layer along an outer circumferential surface of a cylindrical tube on the outer circumferential surface of the cylindrical tube; secondly forming an insulating layer on a surface of the first conductive layer formed in the firstly forming; and thirdly forming a second conductive layer on a surface of the insulating layer formed in the secondly forming.

It is to be noted that any arbitrary combination 5 or rearrangement of the above-described structural components and so forth is effective as and encompassed by the present embodiments. Moreover, all of the features described in this summary are not necessarily required by embodiments so that the embodiment may also be a sub-combination of these described features. In addition, embodiments may have other features not described above.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 6A shows a part of the cross section of the A-A' region shown in FIG. 5A.

FIG. 6B shows a part of the cross section of the B-B' region shown in FIG. 5A.

FIG. 8A shows an appearance of the internal resonance circuit according to the second variation.

FIG. 8B shows the first layer of the internal resonance circuit according to the second variation.

FIG. 8C shows the second layer of the internal resonance circuit according to the second variation.

FIG. 8D shows the third layer of the internal resonance circuit according to the second variation.

FIG. 9A shows a pattern of the first layer of the internal resonance circuit according to an embodiment of the present disclosure.

FIG. 9B shows a pattern of the second layer of the internal resonance circuit according to the embodiment.

FIG. 9C shows a pattern of the third layer of the internal resonance circuit according to the embodiment.

FIG. 10A shows a variation of the pattern of the first layer of the internal resonance circuit.

FIG. 10B shows a variation of the pattern of the second layer of the internal resonance circuit.

FIG. 10C shows a variation of the pattern of the third layer of the internal resonance circuit.

FIG. 11A shows a step of filling a gravure plate with an ink having a predetermined pattern.

FIG. 11B shows a step of causing a transfer roller to receive the ink filling the gravure plate.

FIG. 11C shows a step of transferring the ink to the surface of the cylindrical tube.

FIGS. 13A, 13B, 13C, 13D, 13E, and 13F show a method of forming the first conductive layer of the internal resonance circuit by a photolithographic method.

DETAILED DESCRIPTION OF THE INVENTION

Embodiment

Figure 1B:
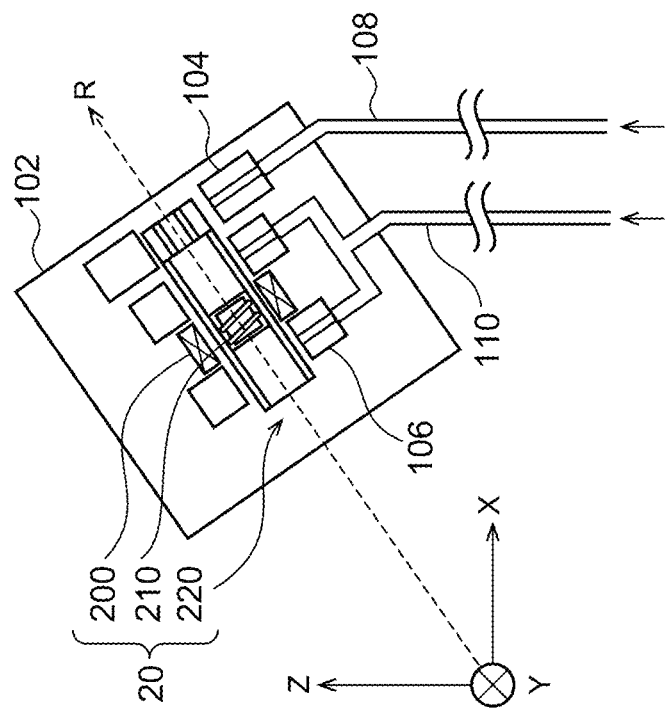
FIG. 1B shows the configuration in the probe according to the embodiment.
Figure 1A:
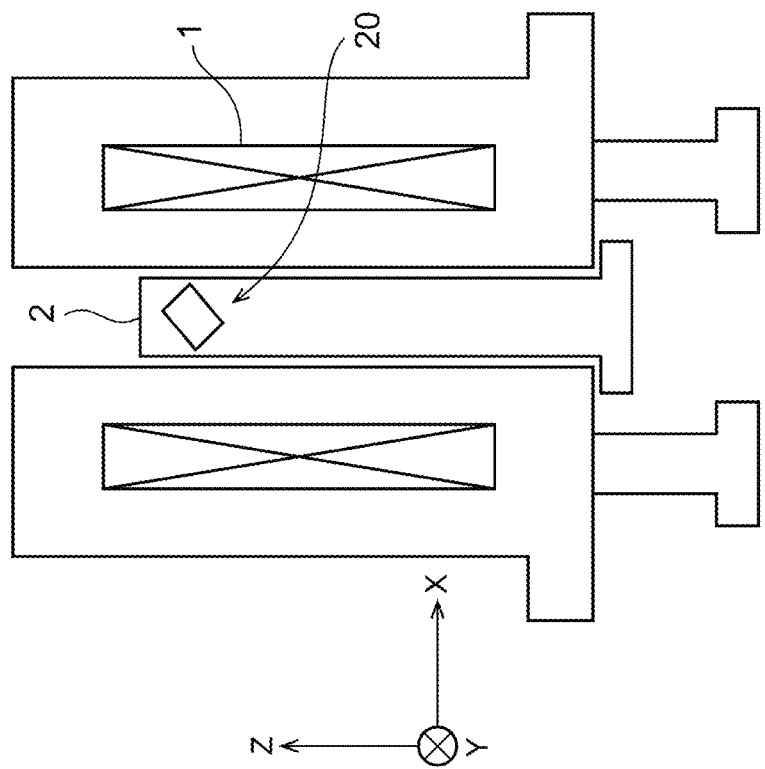
FIG. 1A is a schematic diagram of an NMR apparatus according to an embodiment of the present disclosure.

FIGS. 1A and 1B are schematic diagrams of an NMR apparatus according to an embodiment of the present disclosure. As shown in FIG. 1A, the NMR apparatus is provided with a magnet 1 that generates a static magnetic field in the Z axis direction (vertical direction) and a probe 2 that houses a detection unit 20 in which a sample is placed. The detection unit 20 is provided with a coil (hereinafter, also referred to as "RF coil") placed around the sample and generating radio waves. In NMR measurement, NMR is induced in the sample by causing the RF coil to irradiate the sample in the static magnetic field generated from the magnet 1 with radio waves. The apparatus detects a signal generated based on NMR.

A description will be given of the configuration inside the probe 2 in further detail with reference to FIG. 1B. As shown in FIG. 1B, a housing 102 is provided inside the probe 2. Inside the housing 2 are provided the detection unit 20, a turbine stator 104, a gas bearing stator 106, etc.

At the time of measurement, the detection unit 20 is arranged to face a direction inclined by an angle called a magic angle relative to the direction of static magnetic field (Z axis direction of FIG. 1B). The detection unit 20 includes an RF coil 200, a sample 210, a sample tube 220, etc. The detailed configuration of the detection unit 20 will be described later with reference to FIG. 2.

A compressed air of two systems is supplied to the housing 102. More specifically, the compressed air is supplied to the gas bearing stator 106 supporting the sample tube 220 via a flow passage 110. Further, the compressed air is supplied to the turbine stator 104 via a flow passage 108. The compressed air is used as a drive source for rotating the sample tube 220.

Figure 2:
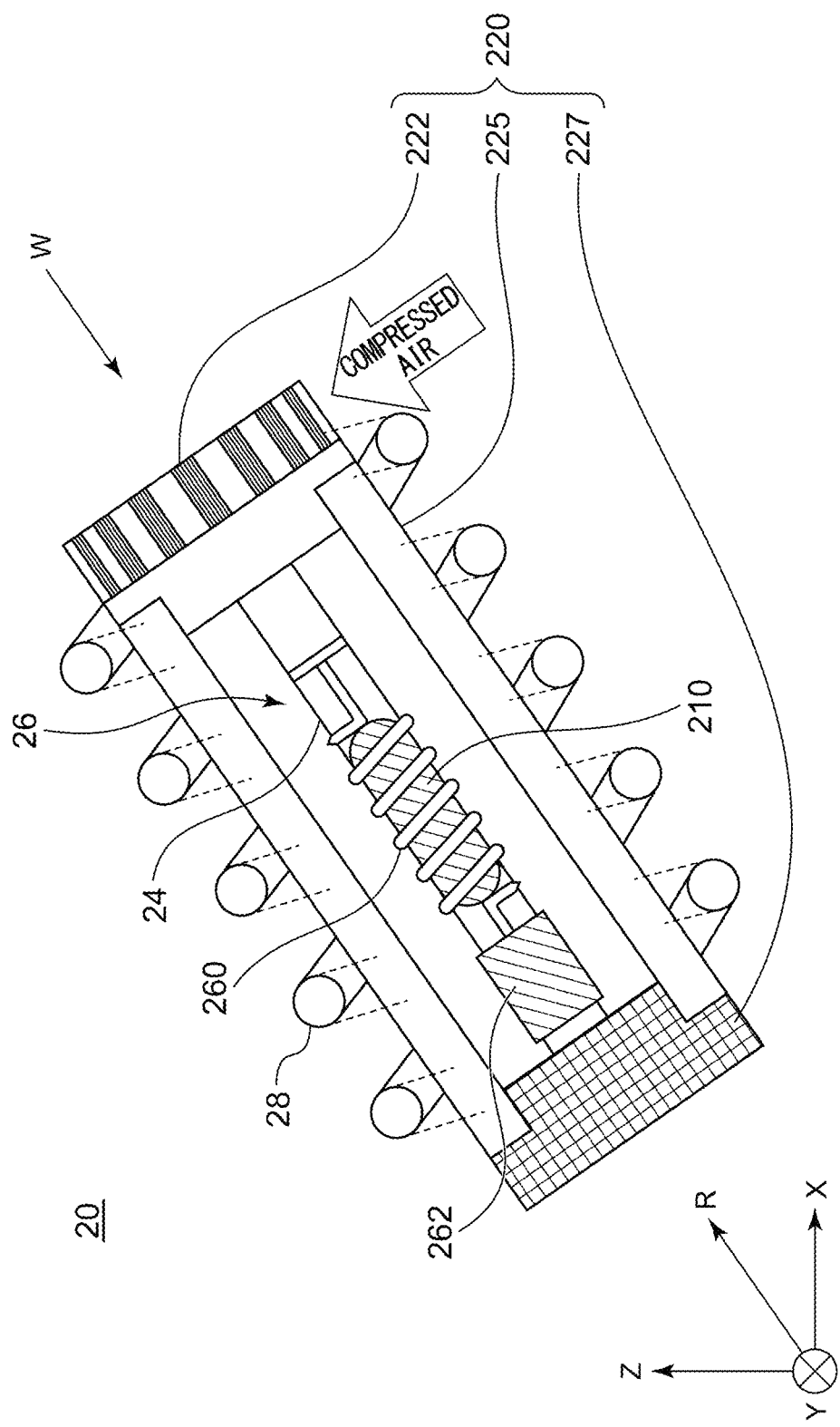
FIG. 2 is a schematic diagram of the detection unit according to the embodiment.

FIG. 2 is a schematic diagram of the detection unit 20 according to the embodiment. As shown in FIG. 2, the detection unit 20 according to the embodiment is provided with the sample tube 220, a cylindrical tube 24 provided inside the sample tube 220, an internal resonance circuit 26 formed along the surface of the cylindrical tube 24, and an RF coil 28 provided to face the outer circumference of the sample tube 220 in a non-contact manner when the sample tube 220 is mounted in the probe 2.

The sample tube 220 is provided with a blade part 222, a housing part 225, and a bottom part 227. The housing part 225 houses the cylindrical tube 24, the internal resonance circuit 26, and the sample 210. The blade part 222 and the bottom part 227 are provided at one end and the other of the housing part 225, respectively, and function as lids of the housing part 225.

The sample tube 220 is inserted at the magic angle relative to the Z axis direction and is rotated around its central axis (R axis) thereof. More specifically, the sample tube 220 is rotated as the blade part 222 provided at the end of the sample tube 220 receives the compressed air from the turbine stator 104 provided inside the probe 2.

Figure 3:
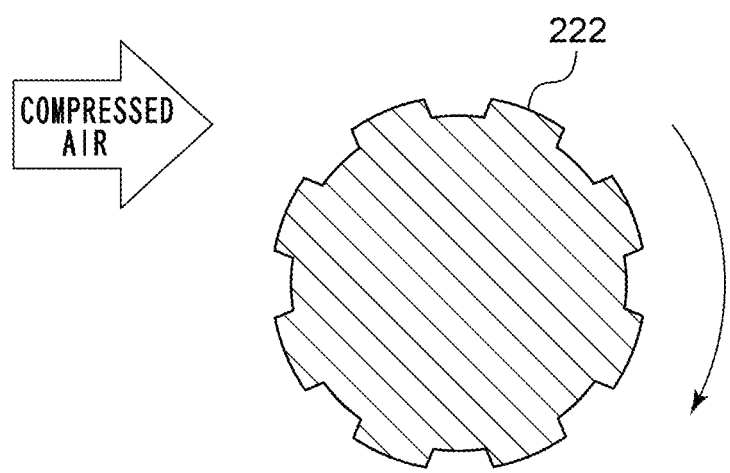
FIG. 3 shows the blade part of the sample tube according to the embodiment.

A description will be given of the rotation with reference to FIGS. 2 and 3. FIG. 3 shows the blade part 222 of the sample tube 220 as viewed in the W direction shown in FIG. 2. The sample tube 220 is rotated as shown in FIG. 3 as the blade part 222 at the end of the sample tube 220 receives the compressed air (wind) as indicated by the arrow of FIG. 2. The wind blows onto the end of the sample tube 220 instead of the center of the sample tube 220. Therefore, not only the weight balance around the rotational axis shown in FIG. 2 but also the weight balance in the longitudinal direction of the sample tube 220 shown in FIG. 2 carries weight. If the sample 210 is housed toward the end of the sample tube 220 or the sample 210 moves in the sample tube 220, for example, the sample tube 220 cannot be rotated. Generally, the balance in the longitudinal direction is maintained by placing the sample at the center of the sample tube 220.

Figure 4:
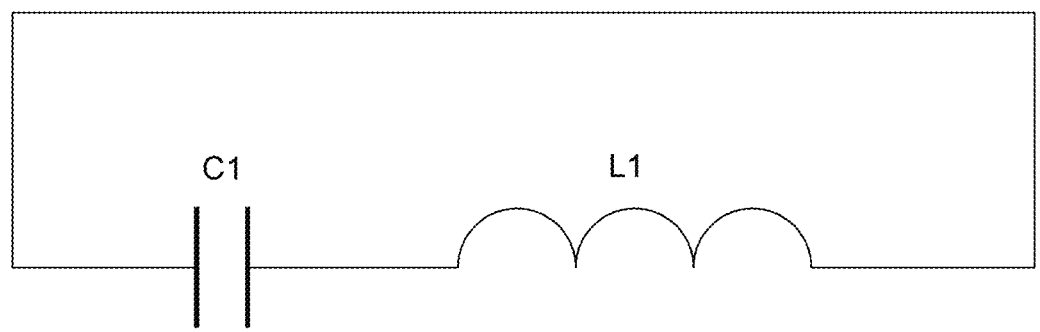
FIG. 4 is a circuit diagram of the internal resonance circuit according to the embodiment.

The internal resonance circuit 26 is provided with a circuit element (specifically, an inductor 260 and a capacitor 262 shown in FIG. 2) fabricated by stacking a conductive layer and an insulating layer on the outer circumferential surface of the cylindrical tube 24. FIG. 4 is a circuit diagram of the internal resonance circuit according to an embodiment of the present disclosure. The internal resonance circuit 26 is configured such that the inductor 260 (L1) and the capacitor 262 (C1) are electrically connected in parallel to form a closed circuit.

At the time of NMR measurement, the RF coil 28 generates radio waves based on a signal transferred from an external apparatus (not shown). This causes the internal resonance circuit 26 to resonate, intensifying the radio waves. The intensified radio waves are projected onto the sample 210 placed inside the cylindrical tube 24 to induce NMR in the sample 210. The RF coil 28 detects a signal based on NMR, and the sample 210 is analyzed by the external apparatus based on the detected signal. Thus, the radio waves are intensified by the internal resonance circuit 26 according to the embodiment. Therefore, the signal based on NMR is intensified and the detection sensitivity is increased as compared with the case without the internal resonance circuit 26.

The internal resonance circuit 26 according to the embodiment is provided inside the sample tube 220 and is provided on the surface of the cylindrical tube 24. The cylindrical tube 24 is a hollow tube having a cylindrical outer surface (hereinafter, referred to as "outer circumferential surface") and a cylindrical inner surface. The sample 210 subject to NMR measurement is placed inside the internal resonance circuit 26. The internal resonance circuit 26 is fixed to the sample tube 220. When the sample tube 220 is rotated, the internal resonance circuit 26 is rotated around the central axis in tandem with the sample tube 220 and the sample 210.

In further accordance with the embodiment, the barycentric position of the entirety of the sample tube 220 and the internal resonance circuit 26 (and the cylindrical tube 24) inserted into the sample tube 220 coincides with the barycentric center of the sample tube 220 without the internal resonance circuit 26 (and the cylindrical tube 24) inserted therein. This makes it possible for the sample tube 220 with the internal resonance circuit 26 (and the cylindrical tube 24) inserted therein to be rotated at a necessary revolving speed (e.g., about 3-20 kHz) around the rotational axis R such that the central axis R of the sample tube 220 is inclined by the magic angle relative to the direction of static magnetic field (Z axis direction). By adjusting the probe 2, the sample tube can be rotated in a stable manner at a revolving speed of about 500 Hz. The upper limit and the lower limit of the revolving speed of the sample tube 220 that ensure stable rotation depend on the size of the probe 2 and the sample tube 220 of the MAS-NMR apparatus. By using the internal resonance circuit 26 of the present disclosure, wobble of the sample tube 220 is suppressed, and the sample tube 220 can be rotated in an extensive range from the lower limit to the upper limit of the revolving speed.

Figure 5A:
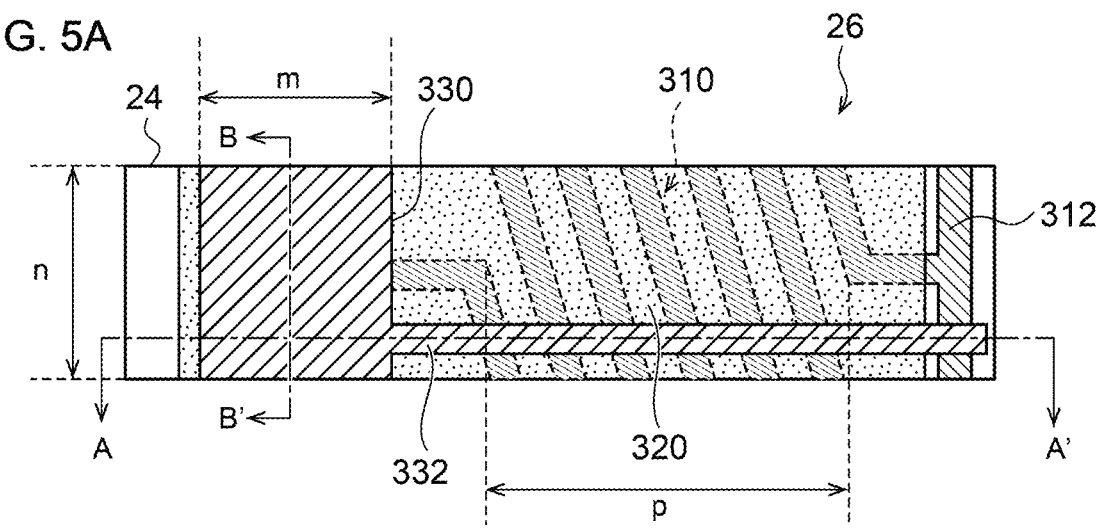
FIG. 5A shows an appearance of the internal resonance circuit according to the embodiment.
Figure 5B:
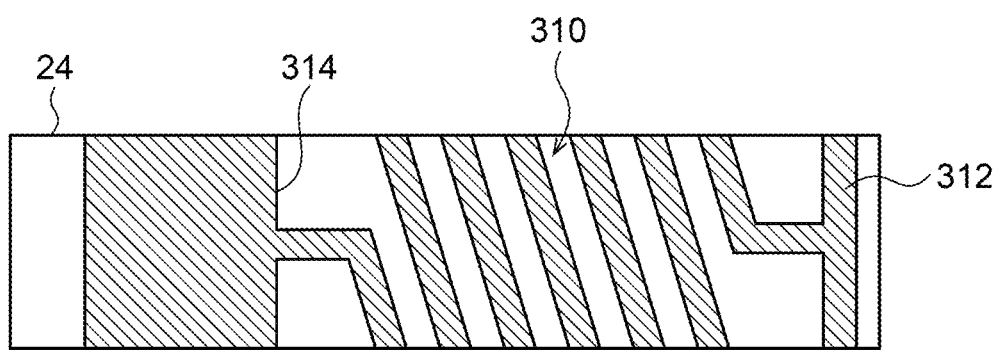
FIG. 5B shows the first layer of the internal resonance circuit according to the embodiment.
Figure 5C:
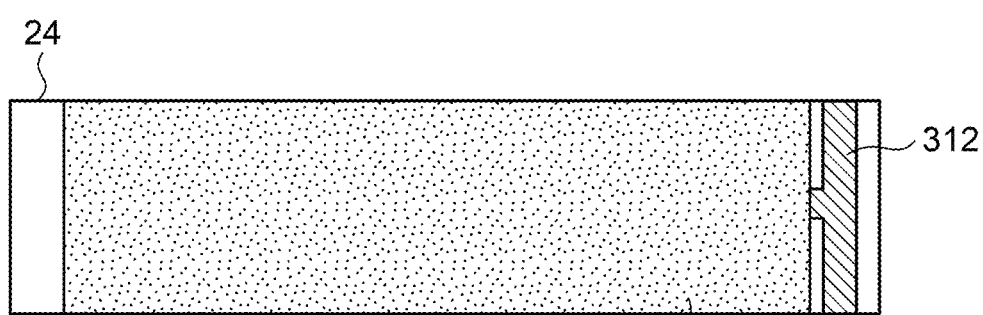
FIG. 5C shows the second layer of the internal resonance circuit according to the embodiment.
Figure 5D:
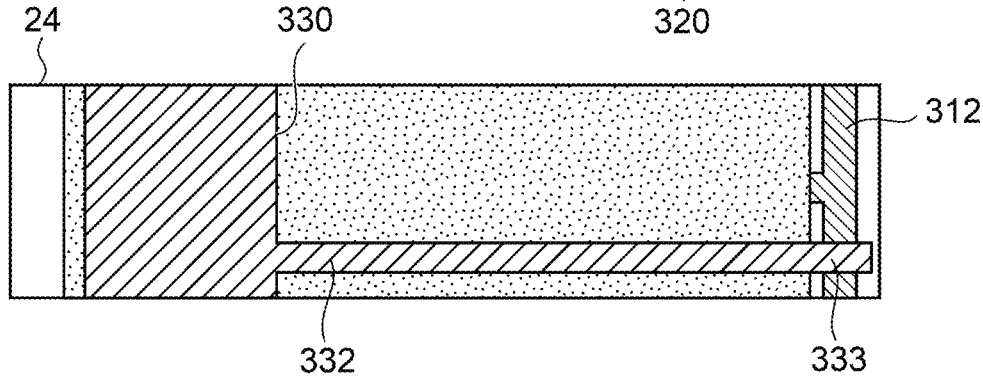
FIG. 5D shows the third layer of the internal resonance circuit according to the embodiment.

A detailed description of the configuration of the internal resonance circuit 26 according to the embodiment will be given with reference to FIGS. 5A-5D. FIG. 5A is a view of the cylinder of the internal resonance circuit 26 according to the embodiment developed over the entire circumference, and FIGS. 5B-5D show the first through third layers of the internal resonance circuit 26 according to the embodiment. The internal resonance circuit 26 according to the embodiment is comprised of a stack of the first conductive layer (first layer) patterned to an arbitrary form, an insulating layer (second layer), and the second conductive layer (third layer) to form the resonance circuit shown in FIG. 4. A description will therefore be given by decomposing the layered structure. Like FIG. 5A, FIGS. 5B-5D are views of the first layer through the third layer formed on the cylindrical tube 24 developed over the entirety circumference.

As shown in FIG. 5A, the internal resonance circuit 26 is provided with various members constituting the resonance circuit. To be more specific, the internal resonance circuit 26 is provided with a wiring part 310 that constitutes the inductor, an upper electrode 330 that constitutes the capacitor, an insulating layer 320, etc. The wiring part 310 having a profile indicated by broken lines is formed underneath the insulating layer 320. The length of the inductor is denoted by p. The area S of the capacitor constituted by the upper electrode 330 may approximate the size of the upper electrode 330 presented when the cylindrical tube 24 is developed. In the example shown in FIG. 5A, S=n×m. A detailed description will be given of the configuration of the layers with reference to FIGS. 5B-5D.

As shown in FIG. 5B, the first layer of the internal resonance circuit according to the embodiment is provided with the wiring part 310, a connecting wire 312 connected to the wiring part 310, and a rectangular lower electrode 314 connected to the wiring part 310. The wiring part 310 constitutes the inductor L1 shown in FIG. 4. Further, the lower electrode 314 constitutes one of the electrodes of the capacitor C1 shown in FIG. 4. The connecting wire 312 is formed to make one turn around the cylindrical tube 24.

As shown in FIG. 5C, the second layer of the internal resonance circuit according to the embodiment is provided with the insulating layer 320. The insulating layer 320 is a layer that includes an insulator and may contain, for example, any of various dielectrics. The insulating layer 320 constitutes the interlayer insulator of the capacitor C1 shown in FIG. 4. The insulating layer 320 is formed to cover the wiring part 310 and the lower electrode 314 of the first layer.

As shown in FIG. 5D, the third layer of the internal resonance circuit according to the embodiment is provided with the rectangular upper electrode 330 and a connecting wire 332 when a cross section of the rectangle is viewed. The upper electrode 330 constitutes the other electrode of the capacitor C1 shown in FIG. 4. The lower electrode 314 of the first layer, the insulating layer 320 of the second layer, and the upper electrode 330 of the third layer constitute the capacitor C1. Further, the upper electrode 330 is connected to the connecting wire 312 of the first layer at a point of contact 333 via the connecting wire 332. This causes the capacitor C1 to be connected to the inductor L1 constituted by the wiring part 310 of the first layer.

A description will now be given of the reason for connecting the first layer and the third layer via the connecting wire 312. Basically, it is sufficient that the first layer and the third layer are in contact. When the first layer and the third layer are formed in the cylindrical tube 24 by a printing method as described later, however, the first layer and the third layer may not be connected if the first layer and the third layer are displaced in the circumferential direction due to misalignment. In the embodiment, the layers are formed by a printing method. Therefore, a pattern with a large alignment margin in the circumferential direction (i.e., printing direction) facilitates alignment in the circumferential direction. As described above, however, the first layer and the third layer may not be connected unless a certain measure is introduced. This is addressed in the embodiment by providing the connecting wire 312 of the first layer to make a turn in the circumferential direction of the cylindrical tube 24 so that the point of contact of the first layer and the third layer may be located at any arbitrary position on the cylindrical tube. Thereby, the point of contact 333 is formed even if the connecting wire 332 of the third layer is displaced in the circumferential direction so that the first layer and the third layer are connected. Thus, the alignment margin is expanded and, at the same time, the first layer and the third layer are connected. Therefore, the form of the connecting wires 312, 332 may be arbitrary so long as the first layer and the third layer are connected.

Thus, by stacking the first layer through the third layer, the internal resonance circuit 26 according to the embodiment is structured such that the capacitor C1 and the inductor L1 are connected in series. In the embodiment, the capacitor and the inductor are formed on the surface of the cylindrical tube 24 so that weight imbalance in the longitudinal direction of the internal resonance circuit 26 and the rotational direction of the sample tube is suppressed. This suppresses imbalance of the sample tube 220 as the sample tube 220 receives the wind and is rotated during MACS-NMR measurement.

FIG. 6A shows a part of the cross section of the A-A' region shown in FIG. 5A. The internal resonance circuit 26 is formed such that the first conductive layer, the insulating layer 320, and the second conductive layer are stacked on the surface of the cylindrical tube 24. Further, the sample 210 is placed inside the cylindrical tube 24.

As shown in FIG. 6A, the first layer includes the lower electrode 314 of the capacitor, wiring parts 310a-310f that constitute the inductor, and the connecting wire 312. The insulating layer 320, i.e., the second layer, is formed to cover the surface of the lower electrode 314 of the capacitor and the wiring part 310. In the embodiment, the insulating layer 320 insulates the inductor from outside and, at the same time, constitutes the interlayer insulator of the capacitor. The second conductor layer, i.e., the third layer, includes the upper electrode 330 of the capacitor and the connecting wire 332 for connecting the third layer and the first layer. A protective insulating layer may be formed on the third layer for the purpose of protecting the capacitor and the point of contact.

FIG. 6B shows the cross section of the B-B' region shown in FIG. 5A. The lower electrode 314, the insulating layer 320, and the upper electrode 330 shown in FIG. 6B constitute the capacitor of the internal resonance circuit. In the embodiment, the electrode constituting one capacitor is formed over the entire circumference of the cylindrical tube, but a plurality of electrodes formed along the circumference may constitute the capacitor. For example, the upper electrode of the capacitor constituting the second conductive layer may be constituted by a plurality of electrodes isolated from each other. By forming mutually different electrodes individually, the capacitance of the capacitor included in the internal resonance circuit can be adjusted by, for example, shaving the electrodes. Accordingly, it is possible to adjust the impedance of the internal resonance circuit more easily than otherwise.

When NMR measurement is conducted, the sample is placed inside the cylindrical tube 24. When the sample is in a small amount, in particular, it is preferred to place the sample 210 inside the region in which the wiring parts 310a-310f constituting the inductor are formed. In this manner, the embodiment ensures that the sample 210 is efficiently exposed to radio waves intensified by the internal resonance circuit and increases the precision of NMR measurement.

Figure 7B:
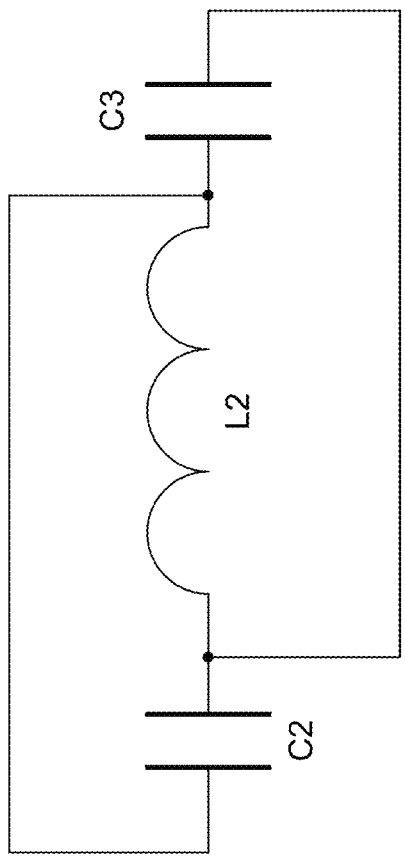
FIG. 7B shows the second variation of the internal resonance circuit.
Figure 7A:
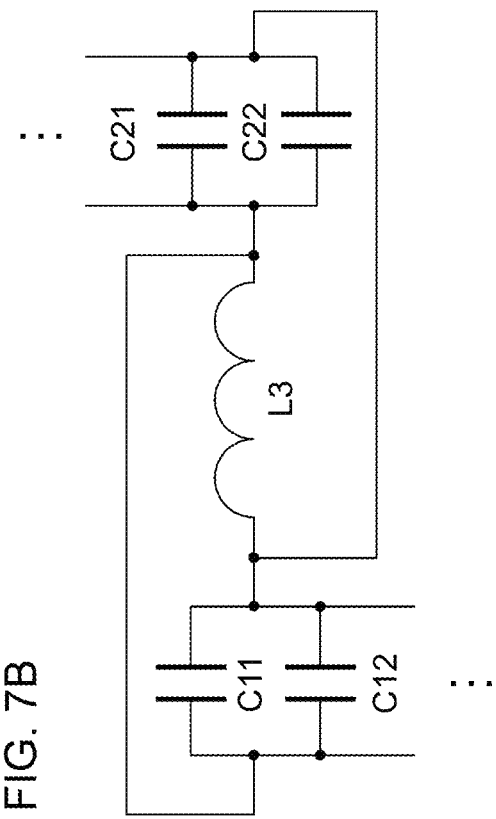
FIG. 7A shows the first variation of the internal resonance circuit.

Variations of the internal resonance circuit will now be described with reference to FIGS. 7A and 7B. FIG. 7A shows the first variation of the internal resonance circuit, and FIG. 7B shows the second variation of the internal resonance circuit.

As shown in FIG. 7A, two capacitors C2, C3 are connected in parallel to one inductor L2 in the internal resonance circuit according to the first variation. Further, as shown in FIG. 7B, a plurality of capacitors C11, C12, C21, C22 are connected in parallel to one inductor L3 in the internal resonance circuit according to the second variation. FIG. 7B shows four capacitors connected in parallel to the inductor L3, but the number of capacitors connected in parallel to the inductor L3 may be 3 or fewer or 5 or more.

The configuration of the internal resonance circuit according to the second variation in which the number of capacitors connected in parallel to the inductor L3 is 4 will be described in further detail with reference to FIGS. 8A-8D. FIG. 8A shows an appearance of the internal resonance circuit according to the second variation, and FIGS. 8B-8D show the first through third layers of the internal resonance circuit according to the second variation.

The internal resonance circuit according to the second variation is provided with, as shown in FIG. 8A, various members constituting the resonance circuit including a wiring part 410 that constitutes the inductor, upper electrodes 430, 432, 434, 436 that constitute the capacitor, insulating layers 420, 422, 424, etc. The wiring part 410 having a profile indicated by broken lines is formed underneath the insulating layer 422. The capacitors formed on the surface of the cylindrical tube 24 are all connected in parallel, and the total area S thereof may approximate the sum of the areas of the upper electrodes 430, 432, 434, 436 presented when the cylindrical tube 24 is developed. A detailed description will be given of the configuration of the layers with reference to FIGS. 5B-5D.

A description will be given of the first layer of the internal resonance circuit with reference to FIG. 8B. The first layer of the internal resonance circuit is provided with the wiring part 410, lower electrodes 400, 402, 404, 406, and contact pads 412, 414, 416. The wiring part 410 constitutes the inductor L3 shown in FIG. 7B. Further, the lower electrodes 400, 402, 404, 406 constitute the lower electrodes of the capacitors C11, C12, C21, C22 shown in FIG. 7B.

The lower electrode 400 and the lower electrode 402 are connected via a wiring 401, and the lower electrode 404 and the lower electrode 406 are connected via a wiring 405. The contact pad 412 is provided in the lower electrode 402, and the contact pad 414 is provided in the lower electrode 404. Further, an end of the wiring part 410 is connected to the lower electrode 402 via a wiring 418, and the other end of the wiring part 410 is connected to the contact pad 416.

In this example, the point of contact of the first layer and the third layer is provided with an alignment margin in the printing direction (circumferential direction). For this purpose, the first layer is provided with the contact pads 412, 414, 416 slightly larger than the third layer overlapping the first layer.

A description will be given of the second layer of the internal resonance circuit with reference to FIG. 8C. The second layer of the internal resonance circuit is provided with the three insulating layers 420, 422, 424 isolated from each other. The insulating layer 420 is formed to cover the lower electrodes 400, 402, the wiring 401, a part of the contact pad 412, and a part of the wiring 418, the lower electrodes 400, 402, the wiring 401, the contact pad 412, and the wiring 418 being shown in FIG. 8B. Further, the insulating layer 422 is formed to cover the wiring part 410 and a part of the contact pad 416, the wiring part 410 and the contact pad 416 being shown in FIG. 8B. Further, the insulating layer 424 is formed to cover the lower electrodes 404, 406, the wiring 405, and a part of the contact pad 414, the lower electrodes 404, 406, the wiring 405, and the contact pad 414 shown in FIG. 8B. Further, a part of the contact pad 412 is exposed between and through the insulating layer 420 and the insulating layer 422, and the contact pads 414, 416 are exposed between and through the insulating layer 422 and the insulating layer 424. This make is possible to connect the first layer and the third layer via the contact pads 412, 414, 416.

A description will be given of the third layer of the internal resonance circuit with reference to FIG. 8D. The third layer of the internal resonance circuit is provided with four rectangular upper electrodes 430, 432, 434, 436, and wirings 431, 433, 435, 438, 440.

The upper electrodes 430, 432, 434, 436 constitute the upper electrodes of the capacitors C11, C12, C21, C22 shown in FIG. 7B. Further, the upper electrode 430 and the upper electrode 432 are formed on the insulating layer 420 and are connected via a wiring 431. The upper electrode 434 and the upper electrode 436 are formed on the insulating layer 424 and are connected via a wiring 435. Further, the upper electrode 432 and the upper electrode 434 are connected via a wiring 438 that passes over the insulating layer 424. Further, the wiring 440 is connected to the contact pad 412 and the contact pad 414 of the first layer.

Thus, the internal resonance circuit according to the second variation can be formed by stacking the first layer through the third layer described above. The internal resonance circuit similar to that of the embodiment can be realized by inverting the pattern of the first layer and the pattern of the third layer.

Further, in the case the amount of sample is extremely small, the smaller the thickness and the diameter of the cylindrical tube 24, the higher the filling factor of the sample inside the inductor formed in the cylindrical tube 24. For this reason, the smaller the thickness of the cylindrical tube 24, the more preferable it is for the purpose of increasing NMR detection sensitivity so long as the rigidity sufficient to maintain the form of the cylindrical tube 24 is maintained.

When the internal resonance circuit of the present disclosure is inserted in a sample tube commonly used for NMR measurement, movement of the internal resonance circuit in the sample tube may result, as described with reference to FIGS. 2, 3, in wobble of the rotational axis failure to rotate the sample tube at a high speed. In that case, it is preferable to insert a spacer between the sample tube and the internal resonance circuit. This suppresses movement of the internal resonance circuit in the sample tube and makes it possible to rotate the sample tube at a higher speed.

The size of the cylindrical tube 24 (e.g., outer diameter, inner diameter, length, etc.) and the wire width and the film thickness in the first through third layers depend on the type of the NMR apparatus, the sample tube, etc. used. Sample tubes for NMR having an outer diameter (inner diameter) of 8.0 mm (6.4 mm), 3.2 mm (2.2 mm), 1.0 mm (0.5 mm), etc. are available. When a sample tube having an outer diameter (inner diameter) of 3.2 mm (2.2 mm) is used, for example, the cylindrical tube 24 may have an outer diameter of 0.5-2.0 mm, a length of 1.5-2.0 mm, and a thickness of 0.05-0.15 mm.

The area of the capacitor, the film thickness of the interlayer insulating layer, the wire width and number of turns of the inductor depend on the measurement frequency (magnetic field strength) of the NMR apparatus used. When 1 H measurement is conducted by using 600 MHZ NMR, it is necessary to adjust the inductor and the capacitor so that the internal resonance circuit resonates with the electromagnetic field of 600 MHz. Given, for example, that the inductor is sized such that the length thereof is 5 mm and the number of turns is 5, the self-inductance will be about 7.5 nH, and it is necessary to connect a capacitor of about 9.4 pF (the length of the inductor is denoted by p in FIG. 5A). This can be realized by a capacitor having parallel electrodes of about 2 mm×2 mm in the case a resin material (the relative permittivity of 2.0-2.5) usable in common printing technology is used in the interlayer insulating film.

Ad described above, the internal resonance circuit according to the embodiment is provided with the inductor formed along the surface (outer circumferential surface of the cylindrical tube 24) of the first cylindrical form having a central axis and the capacitor formed along the surface (outer circumferential surface of the cylindrical tube 24) of the second cylindrical form having the same central axis. Further, the inductor and the capacitor are electrically connected to each other to form a closed loop. According to this embodiment, the inductor and the capacitor are formed along the coaxial cylindrical forms so that the weight balance around the central axis is established easily.

By inserting the internal resonance circuit according to the embodiment inside the sample tube for NMR measurement and using the circuit in MACS-NMR, therefore, it is easy to establish the weight balance around the rotational axis and in the longitudinal direction of the sample tube. As a result, wobble of the sample tube during rotation is suppressed, and the sample tube can be rotated at a revolving speed necessary for measurement and in a stable manner. The lower limit and the upper limit of the revolving speed of the sample tube in the NMR apparatus vary depending on the size of the probe, etc. The higher the revolving speed, the higher the detection sensitivity can be. By using the internal resonance circuit according to the embodiment, wobble of the sample tube during rotation is suppressed in the range between the lower limit and the upper limit of the NMR apparatus used. As a result, the detection sensitivity is increased and the measurement time is reduced in MACS-NMR measurement.

In MAC-NMR, the sample tube may be cooled. The first conductive layer, the insulating layer, and the second conductive layer that constitute the internal resonance circuit are required to have cooling resistance that does not permit peeling, etc. when cooled. The internal resonance circuit fabricated by the printing method or the photolithographic method described later are advantageous in that they have such cooling resistance.

[Method of Manufacturing the Internal Resonance Circuit]

A description will be given of a method of manufacturing the internal resonance circuit according to one embodiment of the present disclosure. To manufacture the internal resonance circuit according to the embodiment, a method of manufacturing an inductor and a capacitor is used, the method including: a first step of forming, on an outer circumferential surface of a cylindrical tube, a first conductive layer along the outer circumferential surface of the cylindrical tube; a second step of forming, on the surface of the first conductive layer formed in the first step, an insulating layer; and a third step of forming, on the surface of the insulating layer formed in the second step, a second conductive layer.

An electronic circuit having such a stack structure can be fabricated by applying a printing technology as well as by a common photolithographic technology. To suppress a damage to a print target (e.g., the cylindrical tube), inkjet printing capable of forming a thin film in a non-contact manner or any of various offset printing processes that bring a rubber soft transfer roller into contact with a print target in a printing process can be used. "Various offset printing processes" in this case refer to inkjet offset printing, screen offset printing, gravure offset printing, reverse offset printing, etc. in addition to common offset printing. Furthermore, rotary screen printing, which is a typical printing method for printing on the surface of a cylindrical form, can be used.

[Method of Manufacturing the Internal Resonance Circuit by Applying Printing Technology (Printing Method)]

FIGS. 9A-9C show exemplary patterns used to fabricate the internal resonance circuit, and FIGS. 10A-10C show variations thereof. It is assumed that the direction a corresponds to the circumferential direction of the cylindrical tube, and the direction b corresponds to the lengthwise direction of the cylindrical tube. Denoting the diameter of the cylindrical tube 24 by $\varphi$, the length in the direction a meets the relationship $d=\pi\varphi\times\alpha$. $\alpha$ denotes a term for correcting expansion and contraction due to printing. In screen printing, for example, the pattern is stretched due to slight expansion of the printing plate, and so $\alpha$ takes a negative value. In gravure offset, the pattern shrinks due to a stretched transfer roller, and so $\alpha$ takes a positive value. In the case a form can be transferred as it is as in photolithography, $\alpha$ will be 0.

To form the first layer, the pattern as shown in FIG. 9A or FIG. 10A can be used. To describe it in further detail, the pattern for forming the first layer includes, as shown in FIG. 9A, a wiring part pattern 510, a lower electrode pattern 512 connected to an end of the wiring part pattern 510, and a connecting wire pattern 514 connected to the other end of the wiring part pattern 510. The wiring part pattern 510 corresponds to the wiring part 310, the lower electrode pattern 512 corresponds to the lower electrode 314, and the connecting wire pattern 514 corresponds to the connecting wire 312.

In the pattern shown in FIG. 9A, the length of the wiring part pattern 510 in the direction a is 6d, and the length of the lower electrode pattern 512 in the direction a is d. By rolling the cylindrical tube on the pattern shown in FIG. 9A in the direction a to make 6 turns, it is possible to transfer the wiring part pattern that makes 6 turns on the surface of the cylindrical tube and the electrode pattern covering the entire circumference of the cylindrical tube.

Development of the side surface of the cylindrical internal resonance circuit results in the form of the internal resonance circuit as shown in FIG. 10A, and so a mask pattern for photolithography having this form can be used. More specifically, the mask pattern has a wiring part pattern 550, a lower electrode pattern 552 connected to an end of the wiring part pattern 550, and a connecting wire pattern 554 connected to the other end of the wiring part pattern 550.

Expansion and contraction in the vertical and horizontal directions could easily occur in printing so that it is difficult to form the inductor in the pattern shown in FIG. 10A. This is addressed by using the pattern as shown in FIG. 9A.

The second layer is formed to cover the entirety of the first layer except for the connecting wire so that an insulating layer pattern 520 as shown in FIG. 9B may be used. However, since it is sufficient that the second layer constitutes the insulating layer of the capacitor and, at the same time, insulates the wiring part of the inductor, the second layer can be formed as shown in FIG. 10B. More specifically, the pattern of the second layer can, as shown in FIG. 10B, be formed to have an insulating layer pattern 560 that constitutes the insulating layer of the capacitor and an insulating layer pattern 562 for insulating the wiring part of the first layer and the connecting wire of the third layer.

The third layer forms the upper electrode of the capacitor and the connecting wire for connecting the capacitor and the inductor so that the pattern as shown in FIG. 10C may be used. The pattern shown in FIG. 9C includes an upper electrode pattern 530 that constitutes the upper electrode of the capacitor and a connecting wire pattern 532 connected to the upper electrode pattern 530.

When a printing technology is used to form the first-third layers, it could be difficult to form the layer depending on the printing method used. It is therefore preferable to deform the pattern into a form to avoid the difficulty. It is extremely difficult with gravure offset printing to form a straight line perpendicular to the printing direction. Therefore, the connecting wire pattern 532 of FIG. 9C may be oblique (i.e., inclined from the direction b). This issue can be resolved by, for example, connecting an oblique connecting wire pattern 572 to an upper electrode pattern 570 as shown in FIG. 10C.

Further, the pattern of each layer can be provided with an alignment marker (e.g., a marker 516 shown in FIG. 9A) as necessary. A marker of a form most suitable for image recognition of the alignment mechanism mounted on a device used in the manufacturing process may be mounted as an alignment marker. By using the alignment marker, the alignment precision of layer stacking can be increased. The alignment marker may be inherently formed on the cylindrical tube. Alternatively, the alignment marker may be transferred to the cylindrical tube and then removed from the cylindrical tube.

A description will now be given of the transfer process performed when any of various offset printing processes is used. In various offset printing, any of various methods is used to cause the surface of a transfer roller to receive a print pattern. In inkjet offset, for example, a pattern is drawn by an inkjet head on the surface of a transfer roller. In screen offset or gravure offset printing, a transfer roller is caused to receive a pattern from a screen printing plate or a gravure plate. The layers can be formed by transferring the pattern received by the surface of the transfer roller to the surface of the cylindrical tube.

An example of fabricating the internal resonance circuit by using gravure offset printing will be shown as an example of fabrication using any of various offset printing processes. The first step according to the embodiment for fabricating the internal resonance circuit includes a step of forming the first conductive layer by rolling the cylindrical tube on the surface of a transfer roller on which a first ink, which will be the first conductive layer, is deposited, thereby transferring the first ink to the outer circumferential surface of the cylindrical tube. Further, the second step includes a step of depositing a second ink on the surface of the first conductive layer by rolling the cylindrical tube formed with the first conductive layer on the surface of a transfer roller on which a second ink, which will be the insulating layer, is deposited. Further, the third step includes a step of depositing a third ink by rolling the cylindrical tube formed with the first conductive layer and the insulating layer on the surface of a transfer roller on which the third ink, which will be the second conductive layer, is deposited.

The steps of forming the first, second, and third layers will be described with reference to FIGS. 11A-11C. Gravure offset printing is performed by filling concave portions in a gravure plate having a predetermined pattern with an ink, causing a transfer roller to receive the ink filling the concave portions, and transferring the received ink to a cylindrical tube, a print target. In the embodiment, the gravure plate pattern in the first step is the pattern corresponding to the first conductive layer. In the second step, the gravure pattern is the pattern corresponding to the insulating layer. In the third step, the gravure pattern is the pattern corresponding to the second conductive layer.

FIG. 11A shows a step of filling a patterned gravure plate 44 with a predetermined ink. First, a blade 40 and the gravure plate 44 shown in FIG. 11A are prepared. The blade 40 is a member having a blade-shaped edge, and the gravure plate 44 includes concave portions 47 having a predetermined pattern. FIG. 11A shows the gravure plate 44 as a plate-shaped member, but a plate having a roll shape may be used.

An ink 42 may be an ink that contains a conductive material or a conductive resin. In the first and third steps, for example, the ink may be a silver paste. In the second step, the ink may be, for example, a resin paste. The viscosity of the ink 42 may be suited to any of various printing technologies used. In the case gravure offset printing is used, for example, high viscosity of about 1000-3000 cps may be used.

First, as shown on the left side of FIG. 11A, a necessary amount of ink 42 is placed on the surface of the gravure plate 44, and, in that state, the blade 40 is moved such that the edge of the blade 40 is contact with the surface of the gravure plate 44, thereby causing the blade 40 to rake the surface of the gravure plate 44. This fills the concave portions 47 of the gravure plate 44 with the ink 48 as shown on the right side of FIG. 11A. The filling action of causing the blade 40 to rake the surface may be performed several times to ensure that the cavities are properly filled. Further, filling actions may be performed at different angles relative to the gravure plate 44. For example, the filling action may be performed 2-3 times in a direction perpendicular to the printing direction and subsequently performed 2-3 times in the printing direction.

It is preferable to fill the concave portions 47 of the gravure plate 44 with the ink while pressing the blade 40 against the gravure plate 44 to apply a filling pressure to the blade 40. The filling pressure preferably has a magnitude that does not cause the ink to remain on the surface of the gravure plate 44 outside the concave portions 47.

Further, the speed of moving the blade 40 (referred to as "filling speed") may have a level (e.g., about 10-30 mm/s) that makes it easy for the ink to cause a dilatancy phenomenon. When a dilatancy phenomenon is caused, the viscosity of the ink is lowered, which makes it possible to fill the concave portions 47 with the ink even if the concave portions 47 are finely patterned.

FIG. 11B shows a step of causing a transfer roller 50 to receive the ink filling the gravure plate 44.

The transfer roller 50 used in gravure offset printing has a cylindrical metal body 52 and a rubber member 53 provided around the metal body 52 and is rotated in the printing direction and the opposite direction. The rubber member 53 may be made of silicon rubber like dimethyl polysiloxane (PDMS) having a low surface energy. Rubber having a thickness of 0.4-0.6 mm and a rubber hardness of about 45 (shore A), which is used in common gravure offset printing, can be used. The rubber member 53 may be stacked on a sponge-like under rubber member for use. Alternatively, a thick and soft transfer roller called a soft blanket having a rubber thickness of 10-30 mm and a rubber hardness (shore A) of 1 or lower (asker C hardness of 5-20) may be used.

As shown in FIG. 11B, the ink filling the concave portions 47 of the gravure plate 44 is received by the surface of the transfer roller 50 by rolling the transfer roller 50 pressed against the gravure plate 44 while the surface of the gravure plate 44 filled with the ink 48 having a predetermined pattern and the surface of the transfer roller 50 are in contact with each other.

The speed of rolling the transfer roller 50 (also called "reception speed") may be similar to the filling speed. For example, the speed of rolling may be 10-100 mm/s, and, more specifically, about 30 mm/s. Further, the pressure with which the transfer roller 50 is pressed against the gravure plate 44 (also called "reception pressure") may be such that the push-in distance is about 0.05-0.6 mm when a rubber for common gravure offset printing is used. When a soft blanket is used, the push-in distance may be about 10-35 mm, although it may vary depending on the thickness of the soft blanket. In this specification, the magnitude of pressure is represented by a push-in distance. The push-in distance is a distance in which the transfer roller is pressed into the gravure plate 44 from a state in which the non-deformed transfer roller and the surface of the gravure plate are in contact with each other. In this way, the printing pressure in printing presses in general is often represented by the distance resulting from pressing or pushing in instead of the actual pressure. The distance may be referred to as push-in distance, nip width, or the like.

FIG. 11C shows a step of transferring the ink to the surface of the cylindrical tube 24. FIGS. 11A-11C and FIG. 12 show the cylindrical tube 24 and the pre-transfer and post-transfer ink on a scale larger than the actual scale to facilitate visual understanding of the respective processes.

As shown in FIG. 11C, the outer circumference of the cylindrical tube 24 is brought into contact with the transfer roller 50 that received the ink. By rolling the cylindrical tube 24 on the surface of the transfer roller 50 in the circumferential direction in this state, the ink 54 on the surface of the transfer roller 50 is transferred to the outer circumferential surface of the cylindrical tube 24. In the transfer process in various offset printing, the printing pressure is often necessary. It is therefore preferable to press the cylindrical tube 24 against the transfer roller 50 for printing. In common gravure offset printing, deformation of the pattern (expansion, contraction, etc.) is reduced by configuring the push-in distance to be identical during transfer and during reception. In the case a soft blanket is used, however, it is difficult to configure the push-in distance during transfer to be identical to the push-in distance during reception. This can be addressed by controlling the expansion and contraction of the pattern by using the a term in $d=\pi\varphi\times\alpha$ described with reference to FIGS. 9A-9C.

Figure 12:
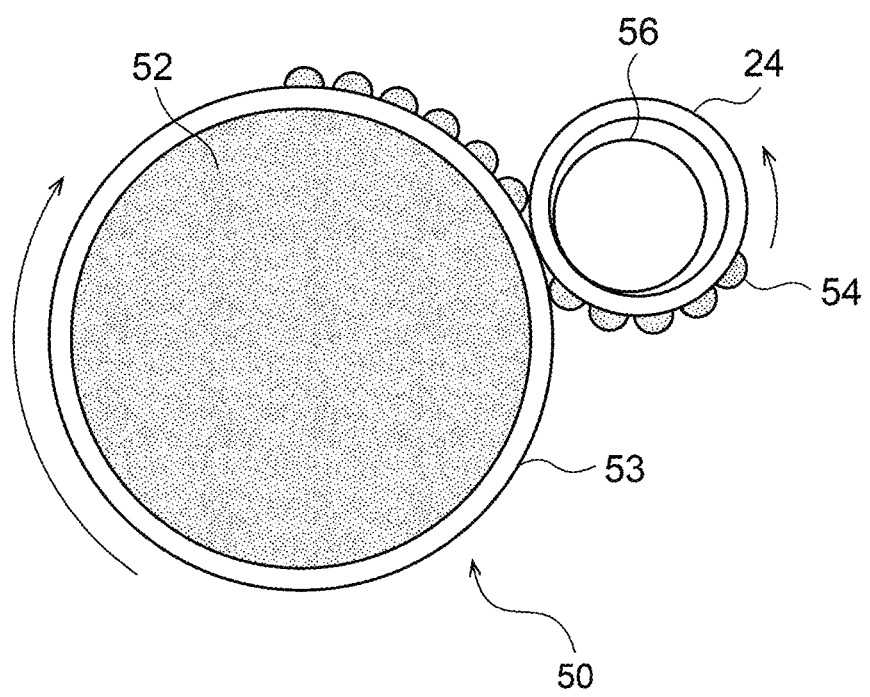
FIG. 12 shows a variation of the method of depositing the ink on the cylindrical tube.

FIG. 12 shows a variation of the method of transferring the pattern to the cylindrical tube 24. By providing a central shaft 56 inside the cylindrical tube 24, a print target, to fix the print target and rotating the transfer roller 50 while the surface of the transfer roller 50 that received a predetermined pattern on its surface and the outer circumferential surface of the cylindrical tube 24 are in contact, the ink can be transferred to the surface of the cylindrical tube. In particular, the transfer roller 50 having a surface made of rubber has tackiness (stickiness) so that the cylindrical tube is also rotated when the transfer roller is rotated. Therefore, a printing mechanism with a co-rotation of the transfer roller and the cylindrical tube can be employed. Co-rotation means that when one of the objects in contact with each other moves, the other is also moved in tandem.

When the internal resonance circuit is fabricated by a printing technology, the ink is dried or calcinated as necessary after printing. The condition (e.g., temperature and time) to dry or calcinate the ink can be set as appropriate depending on the type of ink used. When the ink is a silver paste, for example, it is preferable to calcinate the ink for 10-60 minutes at a temperature of 80-150° C. This solidifies the silver paste, causing it to exhibit conductivity and to be turned it into the conductive layer (the first conductive layer or the second conductive layer). Similarly, it is preferable to calcinate the resin paste that forms the insulating layer for 10-60 minutes at a temperature of 80-200° C. Alternatively, the ink may not be calcinated immediately after printing, and a time for rest, referred to as leveling, of about 10-60 minutes may be provided. We have formed the internal resonance circuit on the surface of the cylindrical tube by using, from among the methods described above, gravure offset printing manufacturing method. We then inserted the cylindrical rube into the sample tube of the MAS-NMR apparatus and rotated the sample tube. We found out that the sample tube can be rotated at a revolving speed of at least 3 kHz. Thus, it is possible, according to the embodiment, to rotate the sample tube in MACS-NMR measurement in a stable manner and at a high revolving speed.

In the above embodiment, a description has been given of an example in which the outer diameter of the cylindrical form (first cylindrical form) on which the inductor is formed and the outer diameter of the cylindrical form on which the capacitor is formed are identical. Alternatively, the outer diameter of the first cylindrical form and the outer diameter of the second cylindrical form may be different from each other so long as the first cylindrical form and the second cylindrical form have the same central axis.

[Method of Manufacturing the Internal Resonance Circuit Using a Photolithography (Photolithographic Method)]

The internal resonance circuit according to the embodiment can be fabricated by using a photolithographic method as well as a printing method described above. Generally, a photolithographic method is defined as a patterning technique for fabricating wirings on a planar substrate. However, a curved surface or the surface of a 3D object can be patterned by photolithography that uses a technique called film exposure. In this way, a wiring can be fabricated on the surface of a cylindrical tube to manufacture an inductor and a capacitor. In this case, a description will be given, with reference to FIGS. 13-17, of a method of fabricating the internal resonance circuit having a circuit configuration similar to that of the circuit diagram shown in FIG. 4 by using a film-exposure photographic method. The internal resonance circuit will exhibit substantially the same appearance whatever fabricating method is used to fabricate it. The internal resonance circuit having the circuit diagram shown in the circuit diagram of FIG. 4 has an appearance of FIG. 5A. The internal resonance circuit fabricated by a photolithographic method has an appearance similar to that of the internal resonance circuit fabricated by a printing technology. The same true of the cross section. FIGS. 13-17 show regions corresponding to the A-A' cross section shown in FIG. 5A, and certain portions of the region are omitted from the illustration.

Like the above-described method of manufacturing the internal resonance circuit in which a printing technology is applied, the method of manufacturing the internal resonance circuit using a photolithographic method includes a first step of forming a first conductive layer; a second step of forming an insulating layer; and a third step of forming a second conductive layer.

A description will be given of the first step with reference to FIGS. 13A-13F. In the first step, a metal layer 600 having a desired thickness is first formed on the outer circumferential surface of the cylindrical tube 24 by a process such as sputtering, vapor deposition, plating, etc. (FIG. 13A). In the case a vacuum film formation process such as sputtering and vapor deposition is used, the material of the metal layer 600 is not particularly limited so long as it is a metal from which the layer can be formed by the process. In consideration of the subsequent processes, however, it is preferable that the material of the metal layer 60 is a metal that can be subject to wet etching, and, more specifically, gold, silver, copper, aluminum, tungsten, molybdenum, etc. Further, the vacuum film formation process is anisotropic so that it is preferable to form the metal layer 600 by rotating the cylindrical tube 24 during film formation in order to form the metal layer 600 evenly on the surface of the cylindrical tube 24. Further, the film formation process is not limited to the vacuum film formation process. As in the case of fabricating common flexible printed circuits (FPC), a thin copper film can be formed on polyimide by electrolysis or electroless plating.

In the case the metal layer 600 is formed by using a vacuum film formation process, it is necessary for the cylindrical tube 24 to have resistance to the process temperature of the vacuum film formation process. It is also necessary for the cylindrical tube 24 to have chemical resistance in the case the metal layer 600 is formed by a plating process. It is therefore preferable that the cylindrical tube 24 be made of a heat resistant and chemical resistant material and, for example, an oxidized metal such as oxidized titanium and oxidized zirconium or a heat resistant resin called engineering plastic such as polyether ether ketone (PEEK) and polyimide (PI).

The entire surface of the metal layer 600 is then coated with a resist to form a resist layer 610 (FIG. 13B). A peelable positive resist or negative resist used in common semiconductor processes can be used as the resist to form the resist layer 610. In a process of forming a resist layer on a planar surface, the resist is applied by using a spin coat method. In the case an object with a 3D form is coated with a resist, dip coating (lift-off method) may be used. In dip coating, the resist layer can be adjusted to have a desired film thickness by adjusting the viscosity of the resist and the lift-off speed. Further, when it is difficult to coat a 3D form with a resist evenly, a dry film resist (DFR), which is in a sheet form and can be used merely by being stuck on a surface, can be used. Similarly, a method of transferring the resist layer 610 to the surface of the metal layer 600 by forming a resist coating film on the surface of a peelable sheet and wrapping the sheet around the surface of the cylindrical tube 24 may be used.

Film exposure is then performed to expose the resist layer 610 to light (FIG. 13C). Film exposure is a method used to pattern a curved surface and the surface of a 3D object. For example, an exposure film 620 for masking, comprised of a transparent film 622 and a light shielding film 624 having a desired light shielding pattern (pattern of the first conductive layer) formed on its surface, is wrapped around the cylindrical tube 24 formed with the metal layer 600 and the resist layer 610. The film is exposed from above to expose the resist layer 610 to light.

In the case a positive resist is used, the light shielding film 624 of the exposure film 620 used herein is patterned in black on the surface of the cylindrical tube 24 to shield light and, elsewhere, is patterned to be transparent. When the light is projected to the exposure film 620, the light is transmitted through the transparent part of the light shielding film 624, exposing the resist layer 610 in that part to light. Meanwhile, the resist layer 610 in the part of the light shielding part remains. Further, a light source having a single wavelength, commonly used for exposure, may be used for exposure. A curved surface or the surface of a 3D object is often exposed to light by using a light source for film exposure that covers a certain range of wavelength. When the direction of irradiation from the light source is limited to one direction, the resist layer 610 may be exposed to light while the cylindrical tube 24 is being rotated by using a rotating mechanism, as in the case of film formation.

Thus, film exposure is defined as a method using an exposure film, produced by providing a flexible transparent film that can be wrapped around or can extend along a 3D object with a desired light shielding pattern, wrapping the exposure film around an object coated with a resist for intimate contact with the surface of the object, and exposing the resist to light. In the case the surface of the exposed object has a complicated form, the exposure film may be deformed by a heat distortion machine or the like to work, before the exposure, the exposure film so that the exposure film is in intimate contact with the target of exposure. In the embodiment, the target of exposure is the cylindrical tube 24 so that the exposure film 620 that is highly flexible and in a sheet form is used.

When the resist layer 610 is exposed by the light from the light source, a bottom anti-reflective coating (BARC) may be formed in advance to suppress the impact from reflected light on the metal layer 600 on the surface of the cylindrical tube 24. A suitable type of the bottom anti-reflective coating may be selected from commercially available products, depending on the type of light source used.

The exposed resist layer 610 is then developed (FIG. 13D). Development is performed by using a developer suited to the applied resist layer 610. Post-development resist layers 610*a*-610*d* remain in a form identical to that of the pattern of the first conductive layer formed on the surface of the cylindrical tube 24, and, in the case of the embodiment, in a form similar to that of the pattern of the first conductive layer shown in FIG. 5B.

The metal layer 60 in a part where the resist layer 610 is removed is etched to form the first conductive layer (metal layers 600*a*-600*d*) having a desired pattern (FIG. 13E). Since it is difficult to apply dry etching to remove a thin film formed on a curved surface or the surface of a 3D object, it is preferable to use wet etching. To wet-etch the metal layer 600, one may use, as an etchant, aqua regia in the case the metal layer 600 comprises gold, a aqueous solution of copper chloride in the case of copper, a mixed acid solution for aluminum etching in the case of aluminum, and a mixture of hydrogen peroxide solution and aqueous ammonium solution in the case of tungsten and molybdenum.

Finally, a peeling solution suited to the resist used is used to peel the resist layers 610*a*-610*d* that remain on the metal layers 600*a*-600*d* (FIG. 13F). This results in the metal layers 600*a*-600*d* having a desired pattern formed on the outer circumferential surface of the cylindrical tube 24.

Figure 14A:
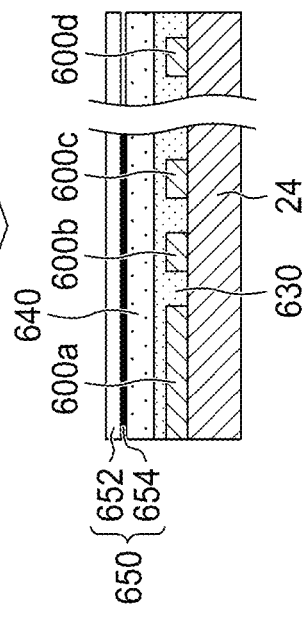
FIGS. 14A, 14B, 14C, 14D, 14E, and 14F show a method of forming the insulating layer of the internal resonance circuit by a photolithographic method.

A description will be given of the second step for forming the insulating layer with reference to FIGS. 14A-14F. In the second step, the insulating layer 630 having insulative property is formed on the surface of the first conductive layer (metal layers 600*a*-600*d*) by using a vacuum film formation method, a solution method, etc. (FIG. 14A). A vacuum film deposition method is exemplified by a method of forming polyparaxylene (parylene), which is a paraxylene-based polymer, by a vapor deposition method or a method of forming silicon dioxide by sputtering. The CVD method, one of the vacuum film formation methods, is advantageous in that an insulative layer having a denser film quality can be formed.

Alternatively, the insulating layer can be formed by applying a composition in a liquid form in which a resin (polymer) such as polyimide, phenol resin, and epoxy resin is dissolved in a solvent, by using a coating applicator such as a dispenser and a spray coater. Depending on the quality of the material of the insulating layer applied, the coating film of the composition in a liquid form can be cured by drying, heating, or exposure to light after the application.

Figure 14B:
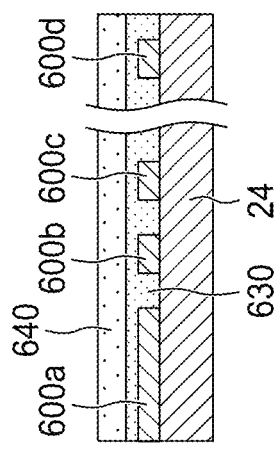
Figure 14C:
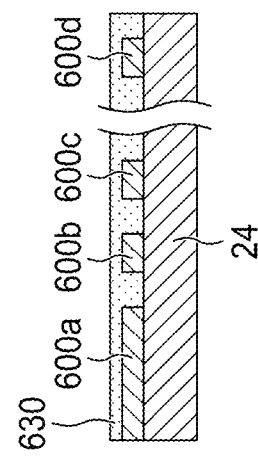
Figure 14D:
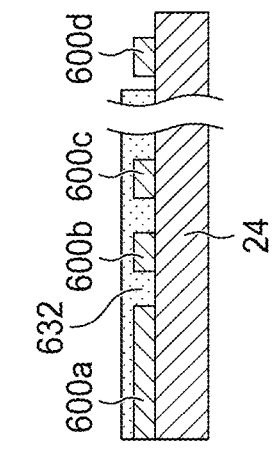
Figure 14E:
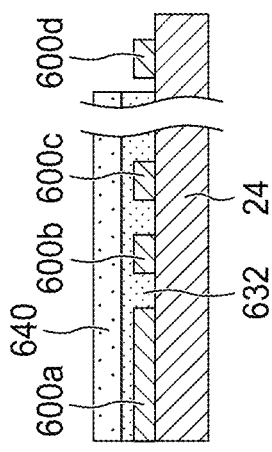
Figure 14F:
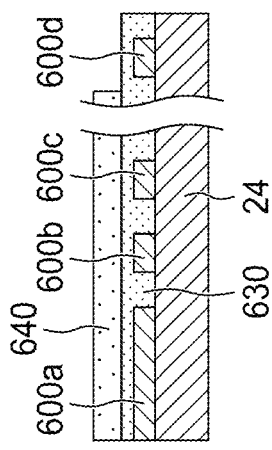

The insulating layer 630 thus formed is patterned into a form of the insulating layer 320 shown in FIG. 5C. In this patterning, as in the first step described above, a resist layer 640 is formed on the upper surface of the insulating layer 630 (FIG. 14B). An exposure film 650 having a transparent film 652 and a light shielding film 654 is then used to expose the resist layer 640 (FIG. 14C), and the resist layer 640 is developed (FIG. 14D). The insulating layer 630 is then etched (FIG. 14E) to remove the resist layer 640 (FIG. 14F). In this way, an insulating layer 632 having a desired pattern is formed.

The insulating layer 632 fabricated in the second step is formed to expose, as described by using FIG. 5C, substantially only the connecting wire 312 of the first conductive layer and to cover the lower electrode 314 and the wiring parts 310*a*-310*f* elsewhere (FIG. 6A). It is therefore possible to form the insulating layer 632 by alternative methods that use a permanent resist, a lift-off method, etc. described below.

Figure 15A:
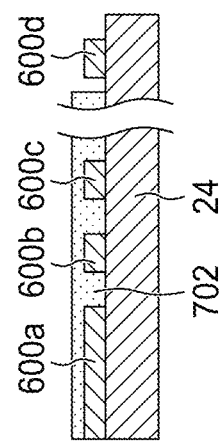
FIGS. 15A, 15B, and 15C show a variation of the method of forming the insulating layer (a permanent resist is used as the resist).
Figure 15B:
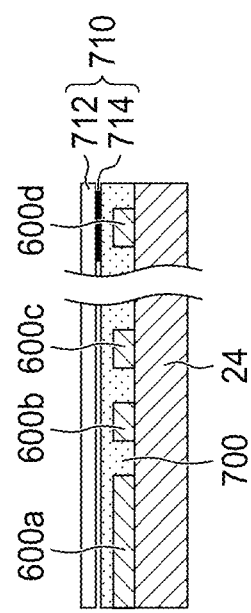
Figure 15C:
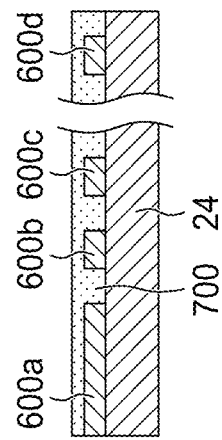

For formation of the insulating layer, a material called permanent resist can be used. A description will be given of a method of forming the insulating layer by using a permanent resist with reference to FIGS. 15A-15C. The insulating layer, which will be the second layer, is made of a material called "permanent resist", "photosensitive permanent film", or the like that can be subject to exposure and development. A permanent resist is a polymer insulator in a liquid form or a sheet form. First, as shown in FIG. 15A, the surface of the cylindrical tube 24 formed with the first conductive layer (metal layers 600*a*-600*d*) is coated with a permanent resist 700. An exposure film 710 having a transparent film 712 and a light shielding film 714 having a desired pattern is used to expose the permanent resist 700 (FIG. 15B). The permanent resist 700 is then developed by using a developing solution (FIG. 15C). In this way, an insulating layer 702 having a desired pattern is formed.

A permanent resist is often a photocurable resin. Therefore, as shown in FIG. 15B, the light shielding pattern of the light shielding film 714 of the exposure film 710 is formed to shield light in a part where the permanent resist is removed and to transmit light in a part where the permanent resist should remain. In this disclosure, either a positive permanent resist or a negative permanent resist may be used.

Figure 16A:
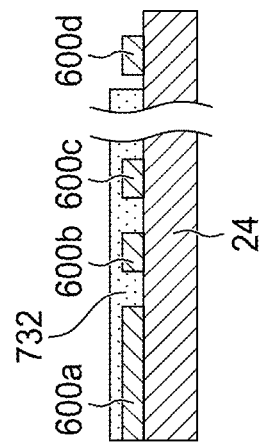
FIGS. 16A, 16B, and 16C show a variation of the method of forming the insulating layer (lift-off method).
Figure 16B:
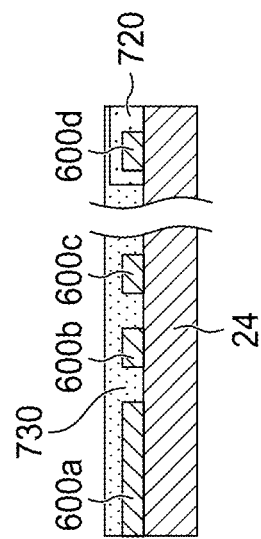
Figure 16C:
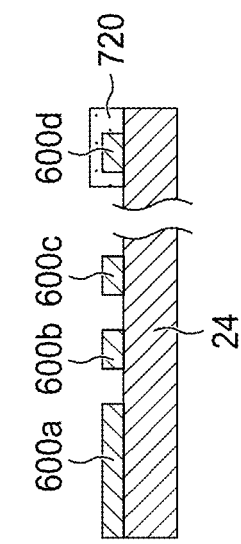

A description will be given of a method of forming the insulating layer by using a lift-off method with reference to FIGS. 16A-16C. First, a resist layer 720 is formed in a region where the insulating layer is not formed (FIG. 16A). The resist layer 720 is made of a material that can be removed later and is called a residual film or a sacrifice layer. An insulating layer 730 is formed on the resist layer 720 and the first conductive layer (FIG. 16B). By removing the resist layer 720, a part of the insulating layer 730 formed thereon is also removed to form the insulating layer 732 having a desired pattern (FIG. 16C).

In the case a high dimensional precision is not required for exposure of the connecting wire 312, an adhesive tape, for example, can be used in place of the resist layer 720. More specifically, the insulating layer 732 having a desired pattern can be formed by sticking the adhesive tape on the connecting wire 312 before forming the insulating layer 732 by a vacuum film formation or solution film formation process and by peeling off the adhesive tape after forming the insulating layer 730 thereby exposing the connecting wire 312.

Figure 17A:
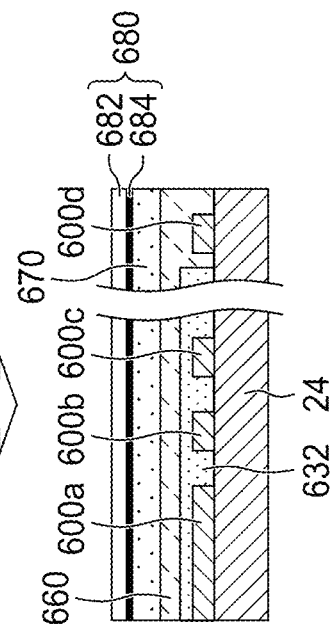
FIGS. 17A, 17B, 17C, 17D, 17E, and 17F show a method of forming the second conductive layer of the internal resonance circuit by a photolithographic method.
Figure 17B:
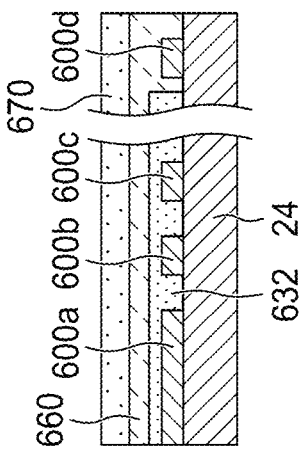

A description will be given of the third step of forming the second conductive layer with reference to FIGS. 17A-17F. In the third step, a metal layer 660 that constitutes the second conductive layer is formed on the first conductive layer (e.g., metal layer 600d) and the insulating layer 632 by using a vacuum film formation method (FIG. 17A).

The metal layer 660 formed in the third step may be made of the same metal as that of the first conductive layer or a metal different from that of the first conductive layer. In the case the second conductive layer is made of a metal different from that of the first conductive layer, the etchant used in wet etching will be different from that of the first conductive layer. When the second conductive layer is made of a metal different from that of the first conductive layer, therefore, there is an advantage in that the metal layer formed in the first step is not severely damaged in wet etching in the third step.

Selectivity in wet etching of a metal may be exploited such that the first or second conductive layer is formed to have a dual layer structure to provide an etching stop layer. For example, the first conductive layer may be made of aluminum, and the second conductive layer is formed in a stack of two layers made of tungsten and aluminum. By forming the tungsten layer to be much thinner than the aluminum layer, high conductivity is secured, and, at the same time, the first conductive layer is prevented from being damaged while the second conductive layer is being etched.

Figure 17C:
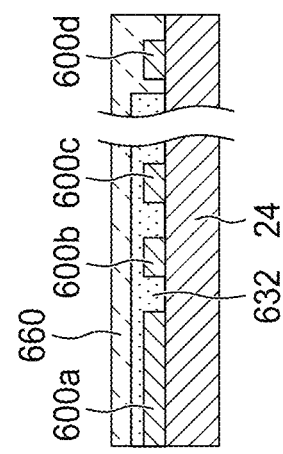
Figure 17D:
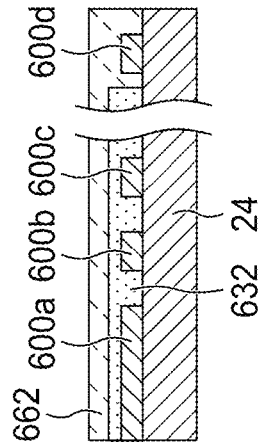
Figure 17E:
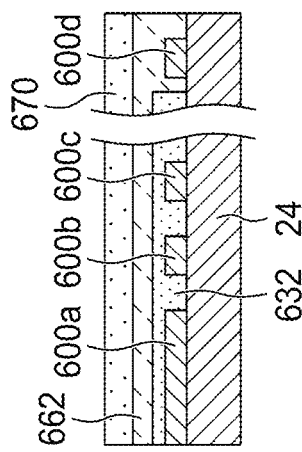
Figure 17F:
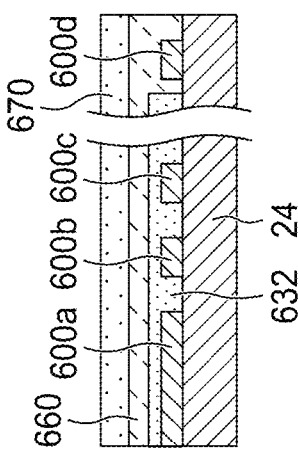

The metal layer 660 thus formed is then patterned in the form of the second conductive layer shown in FIG. 5D. More specifically, the upper surface of the metal layer 660 is coated with a resist to form a resist layer 670, as in the first and second steps described above (FIG. 17B). An exposure film 680 having a transparent film 882 and a light shielding film 684 having a desired light shielding pattern is used to expose the resist layer 670 (FIG. 17C). The resist layer 670 is then developed (FIG. 17D). The metal layer 660 is then etched (FIG. 17E), and the resist layer 670 is removed (FIG. 17F). In this way, the second conductive layer (metal layer 662) having a desired pattern can be formed. FIGS. 17A-17F are diagrams corresponding to the A-A' cross section of FIG. 5A. The second conductive layer does not appear to be patterned in the parts shown in FIGS. 17D-FIG. 17F, but the second conductive layer is patterned in the other parts not shown in FIGS. 17D-17F.

During exposure using the exposure film 680 in the third step, a problem may occur, namely, an irregularity may be produced on the surface of the resist layer 670 in the presence of the first layer and the second layer, creating a gap between the exposure film 680 and the resist layer 670 and failure to cut the pattern edge sharply. In this case, the gap is eliminated and the pattern edge is cut sharply by providing the resist layer 670 with a thin coating of a highly light transmissive resin and wrapping the exposure film 680 from above.

Further, in the case the resist layer 670 cannot be applied evenly in the presence of the first layer and the second layer, a printing method may be used to form the resist layer 670. Further, when a permanent resist or the like is used in the resist layer 670 for the purpose of protecting the conductive layer or the like, the resist layer 670 made of the permanent resist will itself be the insulating layer so that the resist layer may not be peeled off.

The internal resonance circuit having the pattern of FIG. 5A in a development view of the cylindrical tube can be fabricated by the above steps. It is also possible to fabricate the internal resonance circuit having the pattern shown in FIG. 8A through a similar process, by adjusting the form of the pattern.

Methods using photolithography, including a vacuum process, can form a metal layer or an insulating layer that is flatter and denser than by a printing method. Meanwhile, it is difficult, with a photographic method, to form a thick metal layer and, therefore, to reduce the resistance of the internal resonance circuit. To resolve the issue caused by the process, a printing method and a photolithographic method may be combined to build the first through third step. For example, by executing the first and third steps by a printing method and executing the second step by a photolithographic method, it is possible to fabricate the internal resonance circuit having a thick metal layer and a flat and dense interlayer insulating layer.

Exemplary Embodiment

The present disclosure will be described below in further detail with reference to an exemplary embodiment, but the present disclosure is not limited by the exemplary embodiment. In the following, the cylindrical tube provided with the internal resonance circuit obtained in exemplary embodiments 1-2 is evaluated in evaluation examples 1-4 to prove that the tube is extremely useful as a sample tube for NMR measurement.

Exemplary Embodiments 1-2 (Fabrication of the Internal Resonance Circuit by a Printing Method)

In exemplary embodiments 1-2, the internal resonance circuit was fabricated by a printing method on the surface of two types of polyimide cylindrical tubes (PIT-S-(1.30), PIT-S-16) having an inner diameter of 1.3 mm (outer diameter of 1.42 mm) and an inner diameter of 2.0 mm (outer diameter of 2.12 mm), respectively. The internal resonance circuit fabricated on (PIT-S-(1.30) will be referred to as "resonance circuit 1" according to exemplary embodiment 1, and the internal resonance circuit fabricated on PIT-S-16 will be referred to as "resonance circuit 2" according to exemplary embodiment 2.

1. Fabrication of a Gravure Plate

To fabricate the internal resonance circuit by using gravure offset printing, a gravure plate was first fabricated. First, patterns for printing plates are fabricated by using a CAD system or the like. In this example, patterns for printing plates for forming the patterns of the first layer-third layer shown by using FIGS. 9A-9C were fabricated. The exposure films were then fabricated by using these patterns. The exposure film was fabricated by printing a pattern on a thin plastic film by using a multi-function office copier. For fabrication of the gravure plate, a PG plate (PG500 from TORAY INDUSTRIES INC.), a resin plate made of a photocurable resin and capable of fabricating a gravure plate having a print depth of 50 µm, was used. The exposure film thus fabricated was placed on the pre-exposure resin plate. A plate maker (PGP-300 from TORAY INDUSTRIES INC.) was used to expose the film for 2 minutes and 30 seconds. The pattern was developed for 2 minutes and 30 seconds by the developing machine that comes with the plate maker, using a developing solution (developing solution for PG plate making from MINO GROUP Co. Ltd.). The pattern is washed and then dried by the drier that comes with the plate maker. The pattern was then additionally exposed to light by an exposure machine for 5 minutes to fabricate the gravure plate.

The resin plate used is coated with a photocurable resin. The part exposed to light is cured, and the part not exposed to light is dissolved by the developing solution and turns into a concave portion. Therefore, the gravure plate having a plate thickness determined by the film thickness of the photocurable resin is fabricated. Therefore, the exposure films thus fabricated have light-shielding, black patterns of FIGS. 9A-9C and are transparent elsewhere.

2. Fabrication of the Internal Resonance Circuit by Printing

The internal resonance circuit was then fabricated by using a gravure offset printing press for printing on a curved surface (SBG printing press from MT TECH COL LTD) to form the first conductive layer (first layer), the insulating layer (second layer), and the second conductive layer (third layer) on each of two types of polyimide cylindrical tubes (PIT-S-(1.30), PIT-S-16). A conductive ink (XA3656 from FUJIKURA KASEI CO. LTD.) was used to form the conductive layer, and an insulative ink (XB3291 from FUJIKURA KASEI CO. LTD.) was used to form the insulating layer.

First, the gravure plate having the pattern of the first layer and the cylindrical tube, a print target, were fixed to the printing press. The gravure plate was then filled with the conductive ink, and the ink was caused to be received by the blanket. After the reception, a standby time of 30-60 seconds was provided, and then the ink received by the blanket was transferred to the cylindrical tube surface. The cylindrical tube was then left at rest for 10-30 minutes for leveling and was calcinated at 120° C. for 30 minutes to form the first layer.

The gravure plate having the pattern of the second layer and the cylindrical tube formed with the first layer were then fixed to the printing press. The gravure plate was then filled with the insulative ink, and the ink was caused to be received by the blanket. After the reception, a standby time of 15-45 seconds was provided, and then the ink received by the blanket was transferred to the predetermined position on the cylindrical tube surface. The printing of the second and further layers requires alignment, and so the pattern was printed by using the alignment mechanism of the printing press. The cylindrical tube was then left at rest for 10-30 minutes for leveling and was calcinated at 150° C. for 30 minutes to form the second layer.

The gravure plate having the pattern of the third layer and the cylindrical tube formed with the first layer and the second layer were then fixed to the printing press. The gravure plate was then filled with the conductive ink, and the ink was caused to be received by the blanket. After the reception, a standby time of 30-60 seconds was provided, and then the ink received by the blanket was transferred to the cylindrical tube surface. The cylindrical tube was then left at rest for 10-30 minutes for leveling and was calcinated at 120° C. for 330 minutes so as to form the third layer. In this way, the first layer through the third layer were formed by using a printing method to fabricate the internal resonance circuit.

Evaluation Example 1 (Magic Angle Rotation Test)

To confirm that the internal resonance circuit of the present disclosure can be rotated at the magic angle at a high speed in a stable manner without causing a change in the weight balance, the internal resonance circuit fabricated in exemplary embodiment 2 was introduced into a commercially available NMR sample tube and fixed therein to conduct a magic angle rotation test. The NMR sample tube used has an outer diameter of 3.2 mm and an inner diameter of 2.2 mm and has a sleeve made of zirconia. A bench spinner was used in a magic angle rotation test. A bench spinner is an apparatus for checking the stability of magic angle rotation of the sample tube outside the probe in order to prevent the sample tube from being damaged due to improper rotation of the sample tube and to prevent the probe from being damaged due to contact between the sample tube and the coil in the probe. The probe of a commercially available NMR apparatus can of course be used in a magic angle rotation test.

The resonance circuit 1 fabricated in exemplary embodiment 1 was cut to a length of 18 mm to suit the NMR sample tube length and inserted into the sample tube, and a magic angle rotation test was conducted by using the bench spinner. As a result, stable magic angle rotation was confirmed at the revolving speed of 3 kHz, which is commonly required in MAS-NMR. Increasing the revolving speed further, we confirmed stable rotation, marked by a stability of ±5 Hz, at 5 kHz, 7 kHz, 10 kHz, 15 kHz, and 20 kHz.

The resonance circuit fabricated in exemplary embodiment 2 was then inserted into the same NMR sample tube for a magic angle rotation test. It was found that the resonance circuit 2 moved inside the sample tube and could not be rotated. Then a Teflon (registered trademark) tape having a width of 14 mm was wrapped around the resonance circuit 2 to fil a gap between the resonance circuit 2 and the sleeve of the sample tube and was rotated accordingly. Stable magic angle rotation at 3 kHz was confirmed. Increasing the revolving speed further, we confirmed stable rotation, marked by a stability of ±5 Hz, at 5 kHz, 7 kHz, 10 kHz, 15 kHz, and 20 kHz.

The specification value of the revolving speed of the sample tube in the NMR apparatus with a 3.2 mm probe used in exemplary embodiments 1, 2 has an upper limit of 22 kHz. The lower limit is not given as a specification value, but the sample tube is often used at a revolving speed of 3 kHz or higher even in the case of a highly mobile sample (e.g., amandin, a standard sample) that gives a sharp signal at a low speed. Based on the foregoing, it can be said that using) the resonance circuits according to exemplary embodiments 1, 2 suppresses wobble of the sample tube during rotation at a revolving speed between the lower limit and the upper limit and permits conducting MACS-NMR measurement.

Evaluation Example 2 (Cooling Resistance and Durability Test Related to Magic Angle Rotation)

NMR measurement could be conducted at a low temperature or an extremely low temperature so that the internal resonance circuit was evaluated for cooling resistance (cooling tolerance) by repeatedly cooling the internal resonance circuit. A sequence of steps of immersing each of the resonance circuit 1 and the resonance circuit 2 in liquid nitrogen for 1 minute and then taking out the circuit was repeated 5 times. As a result, neither the resonance circuit 1 nor the resonance circuit 2 showed any change in the conductive layer or the insulating layer upon visual inspection. Also, the resistance value did not show any change in resistance measurement using a digital multimeter.

Each of the resonance circuit 1 and the resonance circuit 2 for which the cooling test described above was conducted was inserted into the NMR test tube, and a magic angle rotation test was conducted as in evaluation example 1. As a result, stable rotation at 3 kHz was confirmed. It was found from this that peeling or cracking of the conductive layer and the insulating layer due to cooling does not occur, and the resonance circuit 1 and the resonance circuit 2 can withstand measurement while being cooled.

Evaluation Example 3 (Resonance Characteristic of the Inductor Fabricated by a Printing Method and an External Coil)

Only the part of the inductor (coil) was cut out from the resonance circuit fabricated by a printing method and the characteristic of resonance with an external coil was measured in order to confirm that the internal resonance circuit fabricated by a printing method resonates in a combination with a coil provided outside (detection coil of the NMR apparatus). The inductor used was prepared by cutting the capacitor part from the resonance circuit 2 fabricated in exemplary embodiment 2 so that only the inductor part remains. The electric resistance across the ends was 5Ω.

Figure 18C:
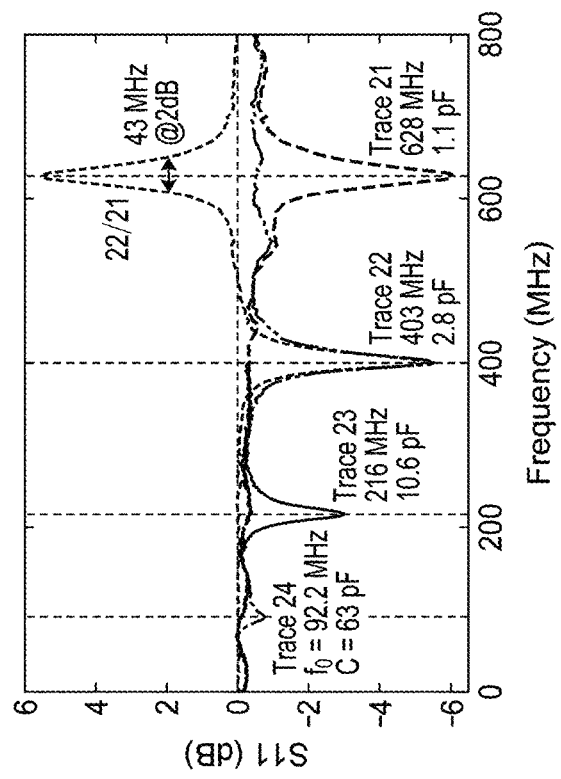
FIG. 18C shows the evaluation result.
Figure 18B:
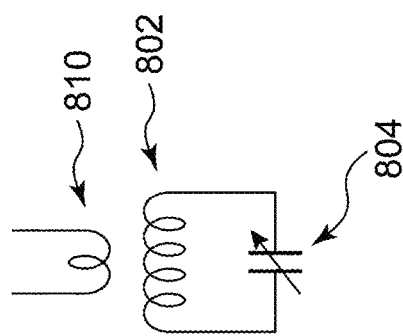
FIG. 18B is a photograph showing an appearance of the system used in the evaluation.
Figure 18A:
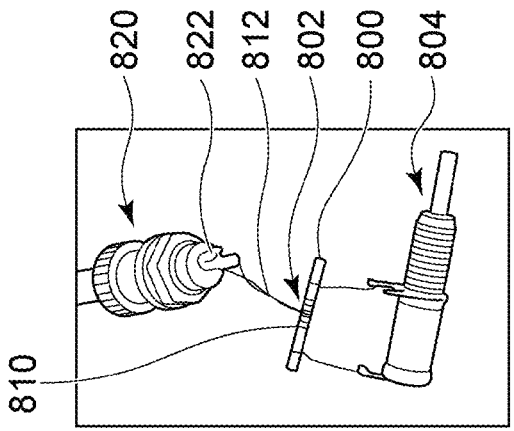
FIG. 18A shows the electric circuit of the system used in resonance characteristic evaluation of evaluation example 3.

FIG. 18A shows an appearance of the system for which resonance characteristic was measured, and FIG. 18B shows the circuit diagram of the measurement system. An inductor 802 (prepared, as described above, by cutting the capacitor part so that only the inductor part remains) of the internal resonance circuit fabricated on the outer circumference of a cylindrical tube 800 by a printing method is connected to a variable capacitor 804 (from Voltronics; NMAP55HVFSK, 1.1-62.7 pF) to form the resonance circuit. A 2-turn coupling coil 810 was formed outside the inductor 802. The inductor 802 and the coupling coil (external coil) 810 were coupled by a mutual inductance. The coupling coil 810 was connected via a wiring 812 to a terminal 822 of a cable 820 connected to a network analyzer (E5061A from Agilent Technology) (not shown) to make the measurement in S11 for measuring the resonance characteristic.

The measurement result is shown in FIG. 18C. Traces 21-24 show the results of measurement of the resonance characteristic at four capacitance values of the capacitance of the variable capacitor 804 from the minimum value (value measured by an LCR meter: 1.1 pF) to the maximum value (measured value: 62.7 pF) The dotted line shows a ratio between Trace 22 and Trace 21. Undulation of the baseline is individually attributable to reflection and absorption by a connector and the coupling coil 810.

The resonance frequency changes with the change in the capacitance of the variable capacitor 804, creating sharp and deep resonance. The Q-value of the circuit as a whole coupled by mutual inductance is about 15. Considering that the floating inductance and capacitance is of a magnitude that is not negligible in an arrangement such as that of this measurement, the Q-value is sufficiently high, and the advantage of intensifying the NMR signal can be fully expected.

Evaluation Example 4 (Result of Simulation of Oscillating Magnetic Field Intensity)

Multiphysics simulation software (COMSOL Multiphysics (registered trademark)) was used to conduct electromagnetic field analysis by a finite element method in order to simulate how the oscillating magnetic field intensity is expected to be intensified when the internal resonance circuit is actually placed in the NMR apparatus.

The internal resonance circuit was placed in the coil of an external NMR apparatus, and a predetermined oscillating current was induced in the coil of the NMR apparatus to simulate the distribution of magnetic flux generated therein. The coil of the external NMR apparatus is unique to the NMR probe and its size is not made public. We therefore estimated a size (the diameter of the lead, the radius of the cross section of the coil, etc.) deemed to be realistic. It is assumed that the internal resonance circuit and a signal detection coil 902 of the NMR apparatus are coupled to form an axially symmetrical circular circuit as shown in FIG. 19A, and infinity is assumed around the coil. Further, the capacitance of the internal resonance circuit was coupled as a dimensionless element to a coil 900.

More specifically, the circular circuit is an axially symmetrical circuit having an axis of symmetry at the position of 0 in the horizontal axis. Only the cross section of the circuit is shown. It is assumed that the coil 902 of the NMR apparatus is a conductor having a circular cross section making 6 turns, and the coil 900 of the internal resonance circuit is a conductor having an elongated oblong cross section making 5 turns to simulate the wiring fabricated by printing on a polyimide cylindrical tube. Calculation for the simulation was conducted in the semicircle (three-dimensionally, a sphere) placed to cover these coils 900, 902. The belt-like part outside is a layer that simulates infinity. Data for bulk copper was used to define the electric resistivity of the two coils.

Figure 19D:
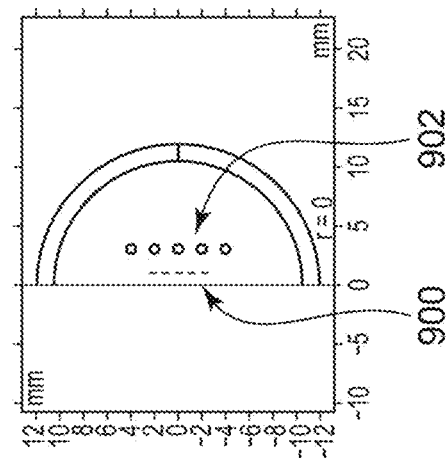
FIG. 19D shows the frequency dependence of the magnetic field intensity at the center of the internal resonance circuit in the simulation.
Figure 19C:
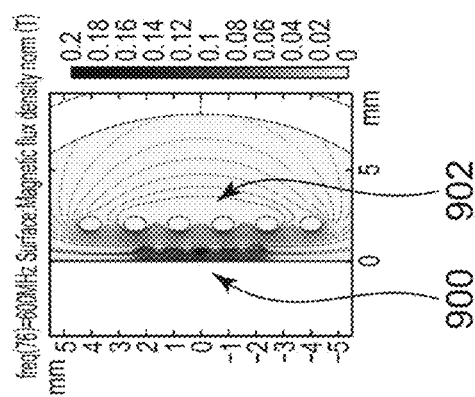
FIGS. 19B and 19C show the simulation results.
Figure 19B:
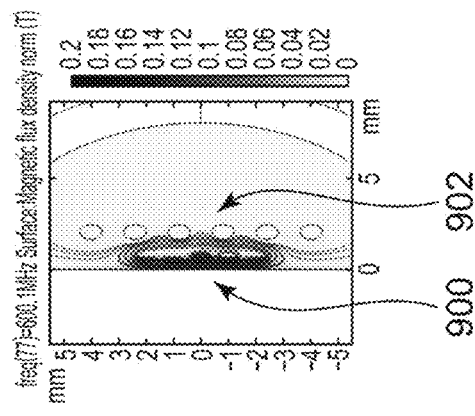
Figure 19A:
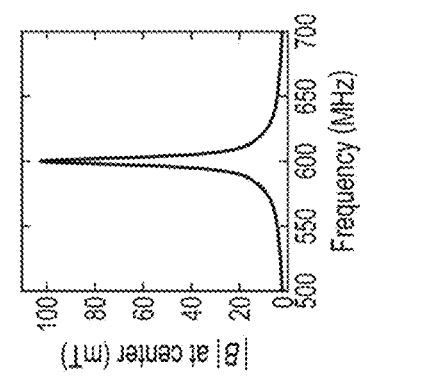
FIG. 19A shows a model used in the calculation in a simulation of the oscillating magnetic filed intensity of evaluation example 4.

The simulation results are shown in FIGS. 19B-19D. FIG. 19B and FIG. 19C show the result of simulation in the cross section bounded on the left end by the coil axis yielded when the resonance frequency of the coils is about 600 MHz and 600.1 MHz, respectively. The magnetic lines of force are represented by solid lines, and the magnitude of the magnetic field is represented by the gray scale. It is demonstrated that the magnetic flux density of the internal coil is large (in darker colors) near the resonance frequency of the internal coil of about 600 MHZ. Beyond the resonance frequency, namely, at 600.1 MHz or higher, the distribution changes such that the magnetic flux of the internal coil enters a gap from the external coil.

FIG. 19D shows the frequency dependence, based on this simulation result, of the magnitude of the magnetic field at the center of the internal resonance circuit. In a narrow range near the resonance frequency, the magnetic field in the internal resonance circuit increases sharply. It can therefore be said that the internal resonance circuit of the present disclosure provides the benefit of intensifying the magnetic field by being placed in the NMR apparatus.

While the preferred embodiments of the present disclosure have been described using specific terms, such description is for illustrative purposes only, and it is to be understood that changes and variations may be made without departing from the spirit or scope of the appended claims.

What is claimed is:

1. A resonance circuit for nuclear magnetic resonance (NMR), comprising:
   a cylindrical tube having a first section and a second section that are positioned side by side along a central axis of the cylindrical tube;
   an inductor formed in the first section of the cylindrical tube in a spiral shape along a circumference of the cylindrical tube; and
   a capacitor formed in the second section around the circumference of the cylindrical tube, wherein
   the inductor and the capacitor are electrically connected to each other to form a closed loop.

2. A method of manufacturing an inductor or a capacitor for nuclear magnetic resonance (NMR), comprising:
   firstly forming a first conductive layer along an outer circumferential surface of a cylindrical tube on the outer circumferential surface of the cylindrical tube;
   secondly forming an insulating layer on a surface of the first conductive layer formed in the firstly forming; and
   thirdly forming a second conductive layer on a surface of the insulating layer formed in the secondly forming.

3. The resonance circuit according to claim 1, wherein the capacitor includes:
   a first conductive layer formed on the surface of the second section of the cylindrical tube;
   an insulating layer formed on a surface of the first conductive layer; and
   a second conductive layer formed along a surface of the insulating layer.

4. The resonance circuit according to claim 1, wherein
   the resonance circuit is inserted inside a sample tube used for NMR measurement,
   a barycentric position of an entirety of the sample tube and the resonance circuit inserted coincides with a barycentric position of the sample tube without the resonance circuit inserted therein, and
   the sample tube is configured to be rotated at a revolving speed of 3-20 kHz around the central axis in a stable manner such that the central axis of the sample tube is inclined by a magic angle relative to a direction of static magnetic field.

5. The resonance circuit according to claim 1, wherein
   the resonance circuit includes a plurality of capacitors, and
   the plurality of capacitors are connected in parallel.

6. The method of manufacturing according to claim 2, wherein
   the firstly forming includes rolling the cylindrical tube on a surface of a transfer roller on which a first ink, which will be the first conductor layer, is deposited, thereby depositing the first ink on the outer circumferential surface of the cylindrical tube,
   the secondly forming includes rolling the cylindrical tube formed with the first conductive layer on a surface of the transfer roller on which a second ink, which will be the second conductor layer, is deposited, thereby depositing the second ink on the surface of the first conductive layer, and
   the thirdly forming includes rolling the cylindrical tube formed with the insulating layer on a surface of the transfer roller on which a third ink, which will be second conductive layer, is deposited, thereby depositing the third ink on the surface of the insulating layer.

7. The method of manufacturing according to claim 2, wherein
   the firstly forming includes forming the first conductive layer on the outer circumferential surface by photolithography, and
   the thirdly forming includes forming the second conductive layer on the outer circumferential surface by photolithography.

8. The resonance circuit according to claim 3, wherein
   the inductor includes a wiring part formed along the surface of the first section of the cylindrical tube, and
   the insulating layer is formed to cover a surface of the wiring part.

9. The resonance circuit according to claim 3, wherein
   the capacitor includes a plurality of second conductor layers formed along the surface of the insulating layer, and
   the plurality of second conductive layers are formed and arranged along a circumferential direction of the second section of the cylindrical tube.

* * * * *